US011682585B2

(12) United States Patent
Liu et al.

(10) Patent No.: US 11,682,585 B2
(45) Date of Patent: Jun. 20, 2023

(54) DEVICES FOR FABRICATION OF SHIELDED MODULES

(71) Applicant: SKYWORKS SOLUTIONS, INC., Woburn, MA (US)

(72) Inventors: Yi Liu, San Diego, CA (US); Anthony James Lobianco, Irvine, CA (US); Matthew Sean Read, Rancho Santa Margarita, CA (US); Hoang Mong Nguyen, Fountain Valley, CA (US); Howard E. Chen, Anaheim, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/231,456

(22) Filed: Dec. 22, 2018

(65) Prior Publication Data

US 2019/0214300 A1 Jul. 11, 2019

Related U.S. Application Data

(63) Continuation of application No. 15/281,393, filed on Sep. 30, 2016, now Pat. No. 10,192,785.
(Continued)

(51) Int. Cl.
*H01L 21/78* (2006.01)
*H01L 21/683* (2006.01)
(Continued)

(52) U.S. Cl.
CPC ........ *H01L 21/78* (2013.01); *H01L 21/32051* (2013.01); *H01L 21/6835* (2013.01);
(Continued)

(58) Field of Classification Search
CPC .............. H01L 21/78; H01L 21/32051; H01L 21/6835; H01L 21/6836; H01L 23/552;
(Continued)

(56) References Cited

U.S. PATENT DOCUMENTS 5,846,676 A 12/1998 Chiba et al.
6,521,479 B1 * 2/2003 Harrison ............ G01R 31/2898
257/29
(Continued)

FOREIGN PATENT DOCUMENTS

JP 08-186191 A 7/1996
TW I452665 B 9/2014
TW I472006 B 2/2015

OTHER PUBLICATIONS

International Search Report and Written Opinion of the International Searching Authority for International Application No. PCT/US2016/054652, dated Mar. 15, 2017.

*Primary Examiner* — Duy T Nguyen
(74) *Attorney, Agent, or Firm* — Chang & Hale LLP

(57) ABSTRACT

Devices for fabrication of shielded modules. In some embodiments, a carrier assembly can be provided for processing of packaged modules. The carrier assembly can include a plate having a first side that defines a plurality of openings, and an adhesive layer implemented on the first side of the plate. The adhesive layer can define a plurality of openings arranged to substantially match the openings of the plate, with each opening of the adhesive layer being dimensioned such that the adhesive layer is capable of providing an adhesive engagement between an underside perimeter portion of a package and a perimeter portion about the corresponding opening of the first side of the plate.

14 Claims, 16 Drawing Sheets

Related U.S. Application Data

(60) Provisional application No. 62/235,437, filed on Sep. 30, 2015.

(51) Int. Cl.
*H01L 21/3205* (2006.01)
*H01L 23/552* (2006.01)
*H01L 23/00* (2006.01)
*H01L 23/31* (2006.01)
*B23K 26/38* (2014.01)

(52) U.S. Cl.
CPC ........ *H01L 21/6836* (2013.01); *H01L 23/552* (2013.01); *H01L 24/14* (2013.01); *B23K 26/38* (2013.01); *H01L 23/3128* (2013.01); *H01L 24/16* (2013.01); *H01L 2221/68354* (2013.01); *H01L 2224/16227* (2013.01); *H01L 2224/97* (2013.01); *H01L 2225/06517* (2013.01); *H01L 2225/06572* (2013.01); *H01L 2924/15311* (2013.01)

(58) Field of Classification Search
CPC ..... H01L 24/14; H01L 23/3128; H01L 24/16; H01L 2221/68354; H01L 2224/16227; H01L 2224/97; H01L 2225/06517; H01L 2225/06572; H01L 2924/15311; H01L 21/56; H01L 23/053; H01L 23/13; H01L 23/3164; H01L 23/66; H01L 24/97; H01L 2924/3025; B23K 26/38
USPC ......................................................... 438/110
See application file for complete search history.

(56) References Cited

U.S. PATENT DOCUMENTS

| | | | |
|---|---|---|---|
| 6,713,857 B1* | 3/2004 | Tsai | H01L 21/568 257/686 |
| 7,645,635 B2* | 1/2010 | Wood | H01L 27/14618 438/113 |
| 8,623,699 B2* | 1/2014 | McConnelee | H01L 24/27 438/106 |
| 9,111,945 B2 | 8/2015 | Tsai et al. | |
| 9,627,352 B2* | 4/2017 | Read | H01L 24/95 |
| 9,661,419 B2* | 5/2017 | Harms | H04R 7/18 |
| 2003/0034557 A1 | 2/2003 | Gupta et al. | |
| 2004/0108590 A1 | 6/2004 | Kledzik et al. | |
| 2005/0269682 A1 | 12/2005 | Onodera et al. | |
| 2006/0035415 A1* | 2/2006 | Wood | H01L 27/14618 438/125 |
| 2008/0213942 A1 | 9/2008 | Hung et al. | |
| 2012/0018857 A1* | 1/2012 | McConnelee | H01L 24/27 257/659 |
| 2012/0037935 A1* | 2/2012 | Yang | H01L 31/0203 257/98 |
| 2013/0341767 A1 | 12/2013 | Watanabe et al. | |
| 2015/0086058 A1* | 3/2015 | Harms | H04R 7/18 381/369 |
| 2015/0325548 A1* | 11/2015 | Read | H01L 24/95 438/106 |
| 2016/0099192 A1* | 4/2016 | Chen | H01L 23/3128 361/772 |
| 2016/0099212 A1* | 4/2016 | Vincent | H01L 25/03 257/774 |
| 2016/0111375 A1* | 4/2016 | Bair | H01L 23/552 438/110 |
| 2017/0117184 A1* | 4/2017 | Liu | H01L 21/32051 |

\* cited by examiner

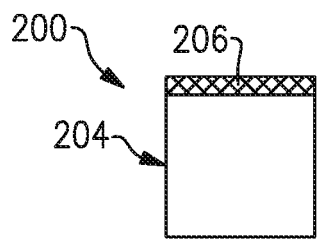 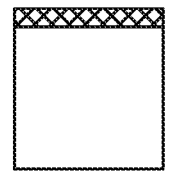
FIG.12A
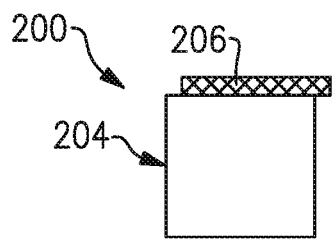 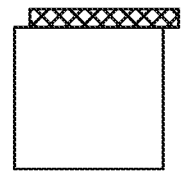
FIG.12B
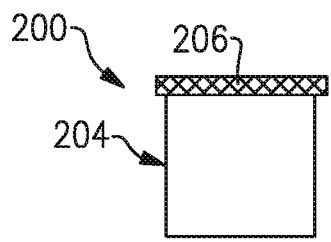 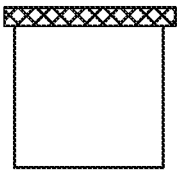
FIG.12C
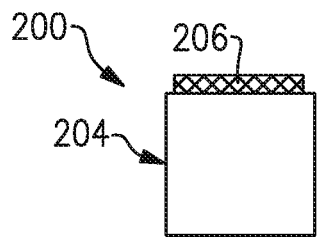 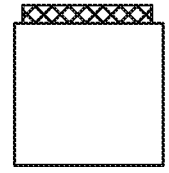
FIG.12D

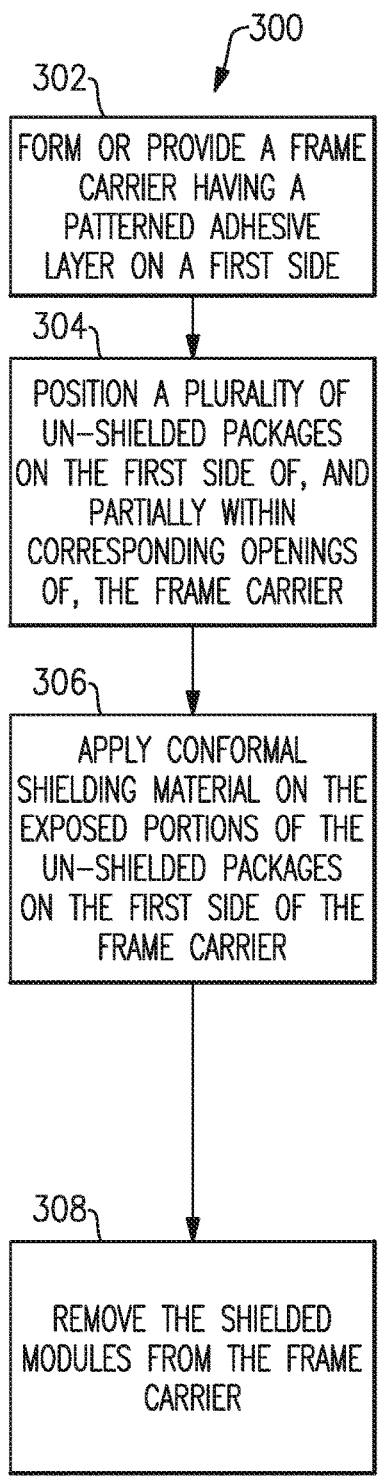
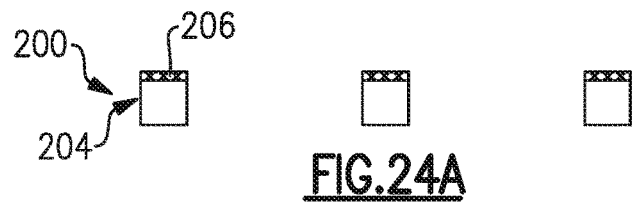
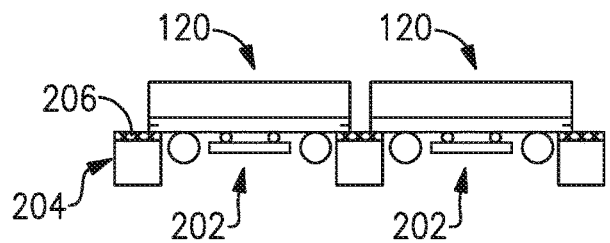
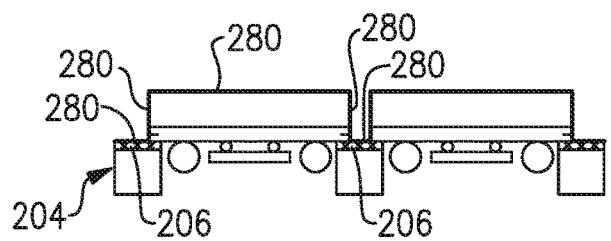
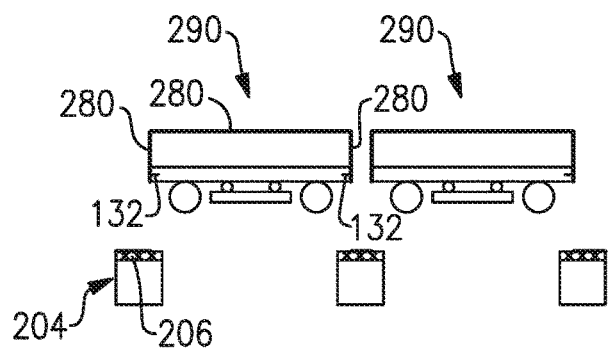

DEVICES FOR FABRICATION OF SHIELDED MODULES

CROSS-REFERENCE TO RELATED APPLICATION(S)

This application is a continuation of U.S. application Ser. No. 15/281,393 filed Sep. 30, 2016, entitled DEVICES AND METHODS RELATED TO FABRICATION OF SHIELDED MODULES, which claims priority to and the benefit of the filing date of U.S. Provisional Application No. filed 62/235,437 Sep. 30, 2015, entitled DEVICES AND METHODS RELATED TO SHIELDED BALL GRID ARRAY PACKAGES, the benefits of the filing dates of which are hereby claimed and the disclosures of which are hereby expressly incorporated by reference herein in their entirety.

BACKGROUND

Field

The present disclosure relates to fabrication of packaged electronic modules such as shielded radio-frequency (RF) modules.

Description of the Related Art

In radio-frequency (RF) applications, RF circuits and related devices can be implemented in a packaged module. Such a packaged module can include shielding functionality to inhibit or reduce electromagnetic interference associated with some or all of such RF circuits.

SUMMARY

In accordance with a number of implementations, the present disclosure relates to a carrier assembly for processing packaged modules. The carrier assembly includes a plate having a first side that defines a plurality of openings, and an adhesive layer implemented on the first side of the plate. The adhesive layer defines a plurality of openings arranged to substantially match the openings of the plate. Each opening of the adhesive layer is dimensioned such that the adhesive layer is capable of providing an adhesive engagement between an underside perimeter portion of a package and a perimeter portion about the corresponding opening of the first side of the plate.

In some embodiments, the plate can include a second side opposite from the first side. Each opening of the plate can extend through the plate between the first side and the second side.

In some embodiments, each opening of the plate and the corresponding opening of the adhesive layer can have a sectional shape similar to a footprint shape of the package. The footprint shape of the package can include, for example, a rectangle. The rectangle shape of each of the opening of the plate and the opening of the adhesive layer has a length and a width each less than a corresponding length and a width associated with the rectangular footprint shape of the package to facilitate the adhesive engagement capability.

In some embodiments, each opening of the plate can be dimensioned to receive and accommodate an underside feature of the package when the package is adhesively engaged with the first side of the plate. The underside feature of the package can include a ball grid array having a plurality of solder balls. In some embodiments, the plate can have a thickness selected such that the solder balls of the package are substantially completely within the opening of the plate when the package is adhesively engaged with the first side of the plate. In some embodiments, the plate can have a thickness selected such that a portion of each solder ball of the package extends beyond the second side of the plate when the package is adhesively engaged with the first side of the plate.

In some embodiments, the adhesive engagement between the package and the first side of the plate can result in substantially the entire underside of each package being protected from exposure from the first side of the plate while the package is held on the first side of the plate. The adhesive engagement between the package and the first side of the plate can result in substantially the entire upper surface and side walls of each package being open to exposure from the first side of the plate.

In some embodiments, each package can be an un-shielded package configured to provide radio-frequency functionality. In some embodiments, each un-shielded package can be a singulated un-shielded package.

In some embodiments, the exposure can include deposition material being introduced to the upper surface and side walls of the package. The deposition material can include sputtered metal.

In some embodiments, the plate can have a rectangular shape. In some embodiments, the plate can have a wafer-like shape. The wafer-like shape can be dimensioned to allow use of the carrier assembly in a deposition apparatus configured to process wafers.

In some embodiments, the adhesive layer can include a double-sided tape. The double-sided tape can include a high-temperature adhesive material such as a silicone adhesive material. The double-sided tape can be based on a polyimide film.

In some embodiments, the openings of the adhesive layer can be pre-cut openings formed prior to the implementation on the first side of the plate. In some embodiments, the openings of the adhesive layer can be openings formed after the implementation on the first side of the plate.

In some teachings, the present disclosure relates to a method for preparing a carrier assembly for processing of packaged modules. The method includes providing a plate having a first side that defines a plurality of openings, and implementing an adhesive layer on the first side of the plate, such that the adhesive layer defines a plurality of openings arranged to substantially match the openings of the plate. Each opening of the adhesive layer is dimensioned such that the adhesive layer is capable of providing an adhesive engagement between an underside perimeter portion of a package and a perimeter portion about the corresponding opening of the first side of the plate.

In some embodiments, the plate can include a second side opposite from the first side, and each opening of the plate can extend through the plate between the first side and the second side. The providing of the plate can include positioning the plate such that its first side generally faces upward.

In some embodiments, the implementing of the adhesive layer can include attaching a double-sided tape on the first side of the plate. The implementing of the adhesive layer can further include forming each opening of the adhesive layer after the double-sided tape is attached to the first side of the plate.

In some embodiments, the forming of each opening of the adhesive layer can include a laser cutting operation. The laser cutting operation can include delivering a laser beam from the second side of the plate such that the corresponding opening of the plate provides a masking functionality for the laser cutting operation.

In some embodiments, the forming of each opening of the adhesive layer can result in a cutout portion being separated from the adhesive layer. The forming of each opening of the adhesive layer can include applying a vacuum from the second side of the plate such that the cutout portion separated from the adhesive layer is removed through the corresponding opening of the plate.

According to some implementations, the present disclosure relates to a method for batch processing of packaged modules. The method includes preparing or providing a carrier assembly that includes a plate having a first side that defines a plurality of openings, and an adhesive layer implemented on the first side of the plate, such that the adhesive layer defines a plurality of openings arranged to substantially match the openings of the plate. The method further includes placing a package over each opening of the plate such that the adhesive layer provides an adhesive engagement between an underside perimeter portion of the package and a perimeter portion about the opening of the first side of the plate. The method further includes performing a processing operation from the first side of the plate on the plurality of packages held over their respective openings of the first side of the plate.

In some embodiments, the adhesive engagement between the package and the first side of the plate can result in substantially the entire underside of each package being protected from exposure during the processing operation. The adhesive engagement between the package and the first side of the plate can result in substantially the entire upper surface and side walls of each package being open to exposure during the processing operation.

In some embodiments, each package can be an un-shielded package configured to provide radio-frequency functionality and having a ball grid array on its underside, with the ball grid array being accommodated by the opening of the plate corresponding to the package. In some embodiments, each un-shielded package can be a singulated un-shielded package.

In some embodiments, the processing operation can include application of a conformal shielding layer to the upper surface and side walls of the package. The conformal shielding layer can be applied by, for example, a sputtering operation.

In some embodiments, the method can further include removing each package having the conformal shielding layer from the plate.

In some implementations, the present disclosure relates to a system for batch processing of packaged modules. The system includes a first sub-system configured to prepare or provide a carrier assembly that includes a plate having a first side that defines a plurality of openings, and an adhesive layer implemented on the first side of the plate, such that the adhesive layer defines a plurality of openings arranged to substantially match the openings of the plate. The system further includes a second sub-system configured to handle a plurality of packages, such that a package is positioned over each opening of the plate such that the adhesive layer provides an adhesive engagement between an underside perimeter portion of the package and a perimeter portion about the opening of the first side of the plate.

In some embodiments, the system can further include a third sub-system configured to perform a processing operation from the first side of the plate on the plurality of packages held over their respective openings of the first side of the plate. The adhesive engagement between the package and the first side of the plate can result in substantially the entire underside of each package being protected from exposure during the processing operation. The adhesive engagement between the package and the first side of the plate can result in substantially the entire upper surface and side walls of each package being open to exposure during the processing operation.

In some embodiments, each package can be an un-shielded package configured to provide radio-frequency functionality and having a ball grid array on its underside. The ball grid array can be accommodated by the opening of the plate corresponding to the package. In some embodiments, the third sub-system can include a sputter deposition apparatus configured to apply a conformal shielding layer to the upper surface and side walls of the package.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIGS. 12A-12D show that an opening of the adhesive layer and an opening of the plate can have different dimensions and/or different relative lateral positions.

FIG. 23 shows a process that can be implemented to form a plurality of shielded modules utilizing a carrier assembly having one or more features as described herein.

FIGS. 24A-24D show examples of various stages corresponding to the process of FIG. 23.

DETAILED DESCRIPTION OF SOME EMBODIMENTS

The headings provided herein, if any, are for convenience only and do not necessarily affect the scope or meaning of the claimed invention.

In many manufacturing applications involving fabrication of packaged modules such as radio-frequency (RF) modules, it is necessary or desirable to perform at least some process steps on singulated units. Various examples related to such process steps on singulated units are described herein in greater detail. Although various examples are described herein in the context of RF modules, it will be understood that one or more features of the present disclosure can also be implemented for processing of other types of packaged electronic modules.

In some embodiments, some or all of the foregoing process steps involving the singulated units can be facilitated by a frame carrier having one or more features as described herein. As also described herein, such a frame carrier and related techniques can allow, for example, high-volume processing of singulated units with desirable precision.

Figure 1:
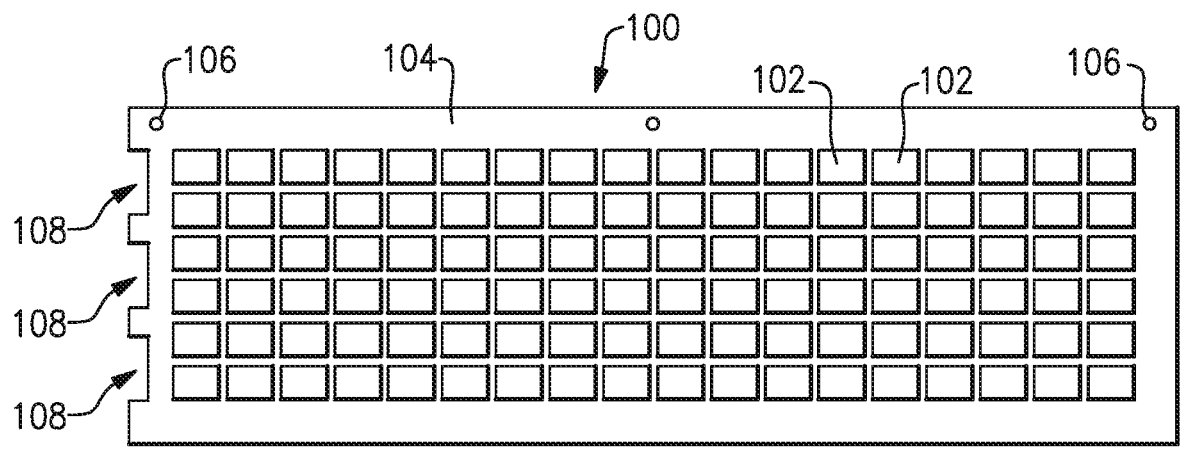
FIG. 1 shows an example of a frame carrier having a plate and an array of apertures configured to facilitate processing of an array of individual units.

FIG. 1 shows an example of a frame carrier 100. For the purpose of description herein, it will be understood that such a frame carrier can include a first side through which individual units (e.g., singulated units) can be introduced to and removed from the frame carrier 100. The second side of the frame carrier can be the side opposite from the first side. For example, if the frame carrier 100 is utilized so that individual units are introduced to and removed from the frame carrier 100 at the frame carrier's upper side, then the frame carrier's upper side can be its first side, and the underside can be its second side. Similarly, if the frame carrier 100 is utilized so that individual units are introduced to and removed from the frame carrier 100 at the frame carrier's lower side, then the frame carrier's underside can be its first side, and the upper side can be its second side. Other orientations of the frame carrier can also be utilized. Accordingly, although various examples are described in the context of introducing and removing individual units on a particular side of a frame carrier, it will be understood that one or more features of the present disclosure can also be implemented in other operating orientations.

In the example of FIG. 1, the frame carrier 100 is shown to include a plate 104 with an array of apertures 102. Each of such apertures can be dimensioned to receive an individual unit, such that a plurality of such individual units can be arranged in an array for further processing.

Figure 2:
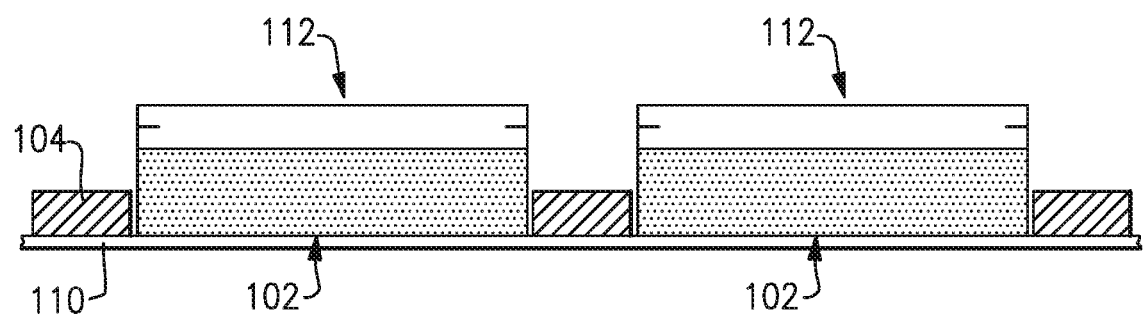
FIG. 2 shows that in some applications, a tape can be provided on the underside of the plate of the frame carrier, such that an adhesive side of the tape engages the plate and the apertures expose the corresponding portions of the adhesive side.

FIG. 2 shows that in some applications, an adhesive sheet such as a tape 110 can be provided on the underside of the plate 104, such that an adhesive side of the tape 110 engages the plate 104 and the apertures 102 expose the corresponding portions of the adhesive side. Thus, an individual unit 112 positioned in a corresponding aperture 102 from the plate's upper side can be temporarily held in place by the tape 110.

In some embodiments, and referring to FIGS. 1 and 2, a frame carrier 100 can include one or more features to facilitate the foregoing operations with an array of individual units. For example, the plate 104 of the frame carrier 100 can define one or more features 106 configured to provide indexing and/or alignment functionality. Such features can be utilized during, for example, loading and unloading of individual units, and processing of the individual units placed in the apertures 102. In another example, the plate 104 of the frame carrier 100 can include one or more tape-removal notches 108 along one or more edges. Such features can be utilized to facilitate tape-removal process.

Additional details and examples related to the frame carrier 100 of FIGS. 1 and 2 can be found in U.S. Patent Application Publication No. 2015/0325548, the disclosure of which is hereby expressly incorporated by reference herein in its entirety.

Figure 3A:
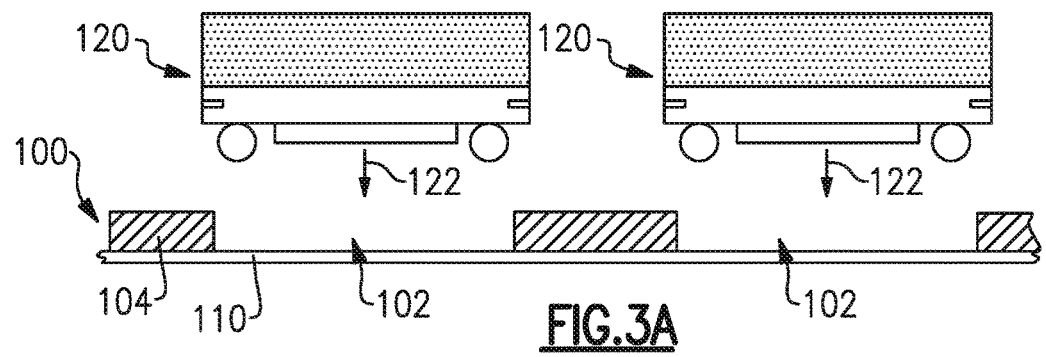
FIGS. 3A-3D show various states of an example process that can be implemented to process individual units with the frame carrier of FIGS. 1 and 2.

In some implementations, the frame carrier 100 of FIGS. 1 and 2 can be utilized to process an array of individual units such as un-shielded dual-sided packages having a ball grid array (BGA). FIGS. 3A-3D show various states of an example process that can be implemented to process such individual units (indicated as 120) with a frame carrier 100. Referring to FIG. 3A, a plurality of un-shielded dual-sided packages 120 can be positioned (arrow 122) partially in their respective apertures 102 defined in a plate 104 and temporarily held in place by a tape 110.

Figure 3B:
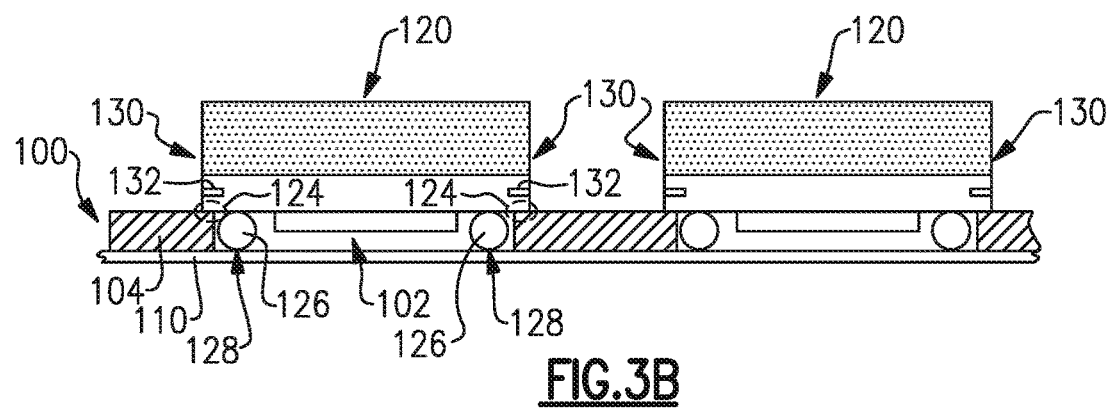

Referring to FIG. 3B, the un-shielded dual-sided packages 120 are shown to be positioned partially in their respective apertures 102. Each aperture 102 is shown to have lateral dimensions to allow solder balls 126 of the corresponding un-shielded dual-sided package 120 to be generally within the aperture 102, but have the underside periphery of the packaging substrate engage the upper surface of the plate 104. Such an engagement between the underside of the packaging substrate and the plate 104 is indicated as 124.

In some embodiments, the thickness of the plate 104 can be selected so that when the un-shielded dual-sided packages 120 is positioned as shown in FIG. 3B, bottom surfaces of the solder balls 126 engage the tape 110. Such an engagement between the solder balls 126 and the tape 110 is indicated as 128.

Once the individual un-shielded dual-sided packages 120 are arranged in such a manner, some or all of the subsequent steps can be performed in manners as if the units are in a panel format. Such steps can include formation of a conformal shielding layer on the upper surface and the side walls (130) of each un-shielded dual-sided package 120. More particularly, the position of the un-shielded dual-sided package 120 relative to the plate 104 allows the side walls 130 to be exposed substantially fully for metal deposition by techniques such as sputter deposition. As further shown in FIG. 3B, the apertures 102 of the plate 104 can be arranged so that the un-shielded dual-sided packages 120 positioned therein are spaced apart sufficiently to facilitate effective sputter deposition of metal on the side walls 130.

Figure 3C:
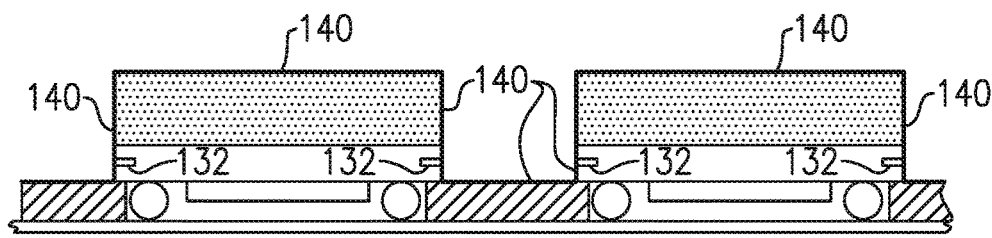

FIG. 3C shows a fabrication state where a conformal conductive layer 140 has been formed. Such a conformal conductive layer (140) is shown to cover the upper surface and the side walls (130) of each dual-sided package. The side wall portion of the conformal conductive layer 140 is further shown to be in electrical contact with the conductive features 132 (which are in turn connected to a ground plane (not shown)) to thereby form an RF shield for the dual-sided package.

In applications where sputter deposition is utilized, the conductive layer 140 can also be formed on the exposed surface of the plate 104 (e.g., between the dual-sided packages). To avoid or limit the build-up of such a layer on the plate 104, various techniques can be utilized. For example, a sacrificial film with appropriate cutouts for the apertures 102 can be provided on the receiving surface of the plate 104. Once sufficient amount of metal has been deposited on the film, it can be discarded, and a new film can be used. In another example, build-up of metal layer on the receiving surface of the plate 304 can be removed periodically or as needed.

Figure 3D:
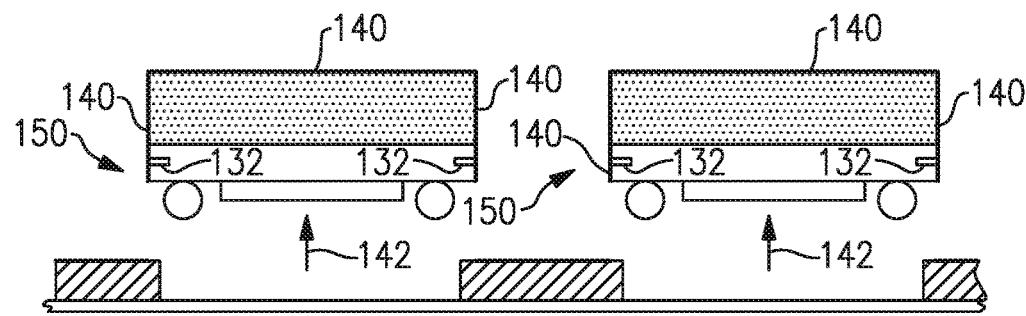

FIG. 3D shows a fabrication state where shielded dual-sided packages 150 are being removed (arrow 142) from the frame carrier. Such shielded dual-sided packages can then be utilized as is, or undergo additional steps such as testing.

Figure 4A:
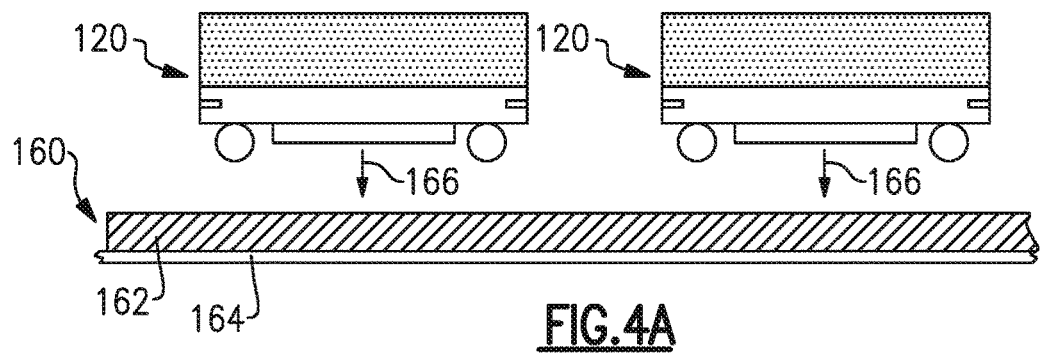
FIGS. 4A-4D show various states of another example process that can be implemented to process individual units.

FIGS. 4A-4D show various states of another example process that can be implemented to process individual units such as the un-shielded dual-sided packages 120. Referring to FIG. 4A, a fabrication state can include a plurality of un-shielded dual-sided packages 120 being positioned (arrow 166) over an adhesive layer 162. Examples of the adhesive layer 162 may include a layer of glue, a layer of paste, a layer of epoxy/epoxy resin, etc. The adhesive layer 162 may be deposited over a surface 164 of a carrier assembly 160.

Figure 4B:
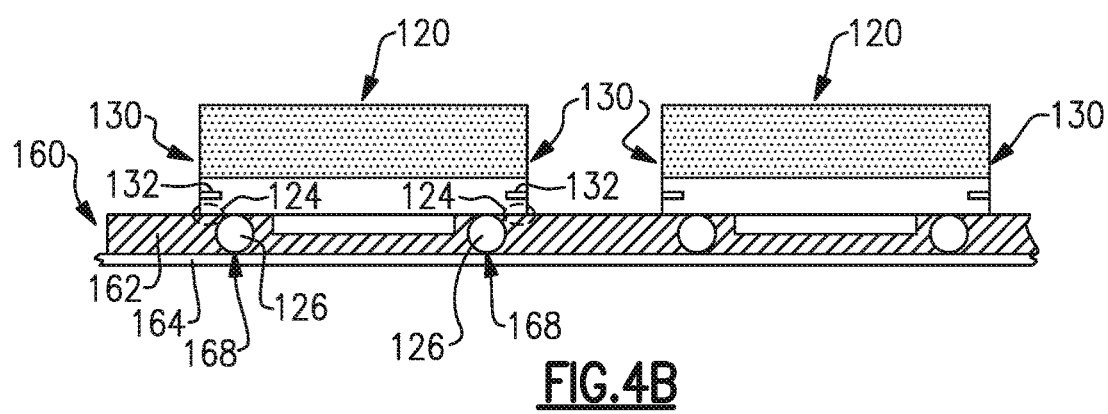

Referring to FIG. 4B, a fabrication state can include the un-shielded dual-sided packages 120 positioned such that the solder balls 126 engage (e.g., are in contact with) the surface 164. In some embodiments, the thickness of the adhesive layer 162 can be selected so that when the un-shielded dual-sided packages 120 is positioned as shown in FIG. 4B, bottom surfaces of the solder balls 126 engage the surface 164. Such an engagement between the solder balls 126 and the surface 164 is indicated as 168. As shown in FIG. 4B, the underside periphery of the packaging substrate may engage the adhesive layer 162 (e.g., may contact the adhesive layer 162). Such an engagement between the underside of the packaging substrate and the adhesive layer 162 is indicated as 124.

Once the individual un-shielded dual-sided packages 120 are arranged in such a manner, some or all of the subsequent steps can be performed in manners as if the units are in a panel format. Such steps can include formation of a conformal shielding layer on the upper surface and the side walls (130) of each un-shielded dual-sided package 120. More particularly, and as described herein, the position of the un-shielded dual-sided package 120 relative to the carrier assembly 160 allows the side walls 130 to be exposed substantially fully for metal deposition by techniques such as sputter deposition. As further shown in FIG. 4B, the un-shielded dual-sided packages 120 can be arranged so that the un-shielded dual-sided packages 120 positioned therein are spaced apart sufficiently to facilitate effective sputter deposition of metal on the side walls 130.

Figure 4C:
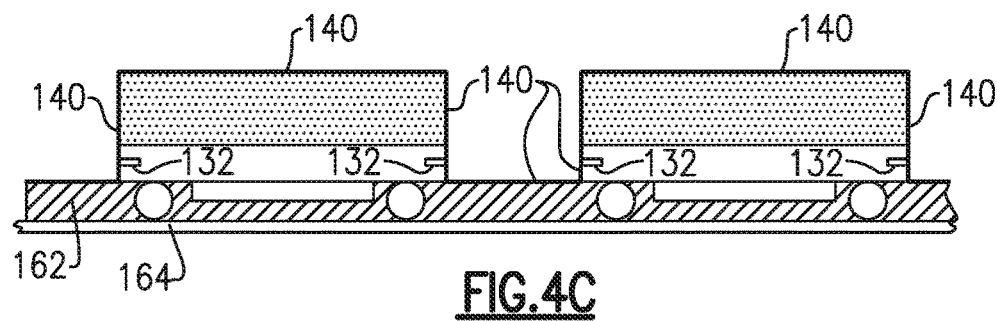

FIG. 4C shows a fabrication state where a conformal conductive layer 140 has been formed. Such a conformal conductive layer 140 is shown to cover the upper surface and the side walls (130) of each dual-sided package. The side wall portion of the conformal conductive layer 140 is further shown to be in electrical contact with the conductive features 132 (which are in turn connected to a ground plane (not shown)) to thereby form an RF shield for the dual-sided package.

Figure 4D:
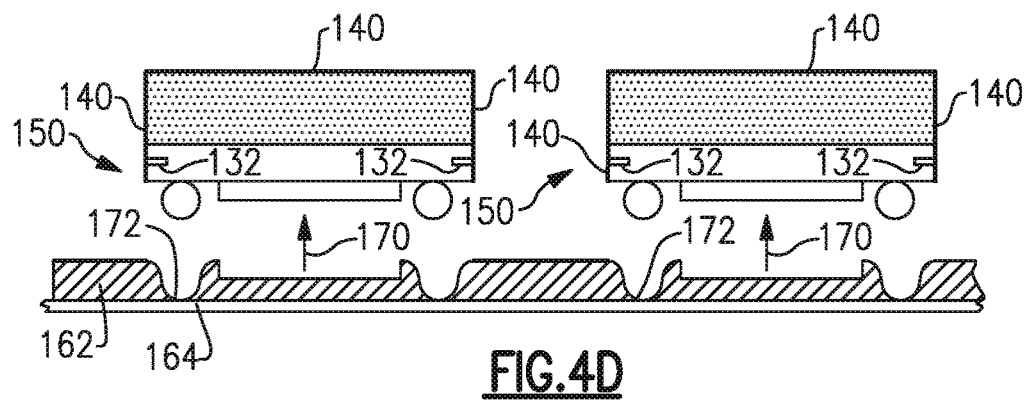

FIG. 4D shows a fabrication state where shielded dual-sided packages 150 are being removed (arrow 170) from the carrier assembly. Such shielded dual-sided packages can then be utilized as is, or undergo additional steps such as testing.

As shown in FIG. 4D, indentations 172 may be present in the adhesive layer 162 (e.g., semi-circle indentations and/or rectangular indentations) after the shielded dual-sided packages 150 are removed from the adhesive layer 162. The indentations 172 may be formed, caused, and/or created by the solder balls 126, the underside of the shielded dual-sided packages 150, and/or component(s) mounted on the underside of the shielded dual-sided packages 150. In some situations, portions of the adhesive layer 162 may remain attached (e.g., may stick) to the shielded dual-sided packages 150 when the shielded dual-sided packages 150 are removed. The portions of the adhesive layer 162 that remain attached to the shielded dual-sided packages 150 may be removed in a later process. For example, the portions of the adhesive layer 162 that remain attached to the shielded dual-sided packages 150 may be removed during a cleaning process.

Figure 5:
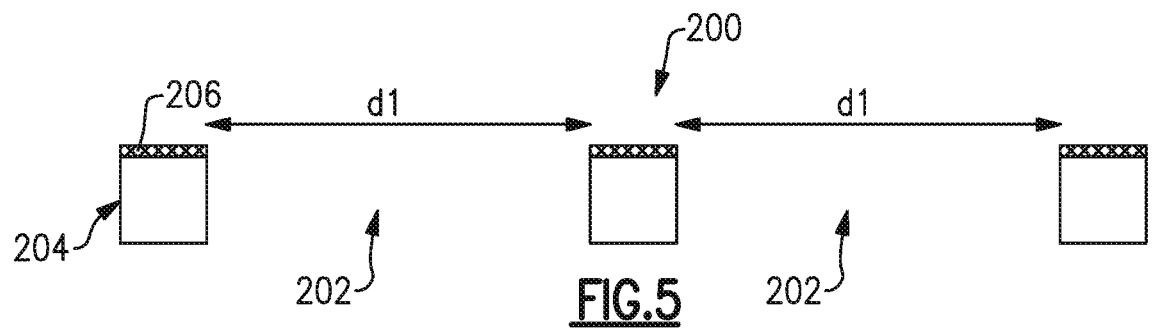
FIG. 5 shows that in some embodiments, a carrier assembly can include a plate having a plurality of openings, and an adhesive layer implemented on a first side of the plate.

FIG. 5 shows that in some embodiments, a carrier assembly 200 can include a plate 204 having a plurality of openings 202, and an adhesive layer 206 implemented on a first side of the plate 204. For the purpose of description, the first side of the plate 204 is depicted as being the upper side of the plate 204. However, it will be understood that one or more features of the present disclosure can also be implemented when the first side of the plate is oriented in different directions.

In some embodiments, the adhesive layer 206 can be patterned to generally match the openings 202 of the plate 204. For example, the adhesive layer 206 can generally cover the areas of the plate 204 that surround each opening 202. Such an opening can be dimensioned to support a perimeter portion of a package, while allowing an inner lower portion of the package to extend into the opening. Accordingly, the adhesive layer 206 can secure the perimeter portion of the package to the plate 204 at some or all of the plate's edge portion defining the corresponding opening 202.

In some embodiments, the adhesive layer 206 can include, for example, a double-sided tape, a layer of glue, etc. In some embodiments, the plate 204 can be similar to a frame carrier such as the example described in reference to FIGS. 3A-3D. As described herein, having the patterned adhesive layer 206 on the receiving side (first side) of the plate 204 can provide a number of advantageous features. Examples of such advantageous features are described herein in greater detail.

Use of such patterned adhesive layer can allow securing of an array of packages to the carrier assembly 200. While various examples are described herein in the context of the packages being dual-sided packages having a ball grid array (BGA), it will be understood that processing of other types of packages can benefit from use of the carrier assembly 200.

Figure 6:
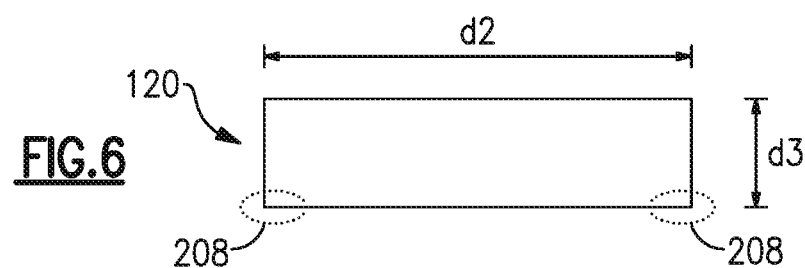
FIG. 6 shows that in some applications, a package, such as an un-shielded package, mountable to the carrier assembly of FIG. 5 does not necessarily need to have any features or structures on its underside.
Figure 7:
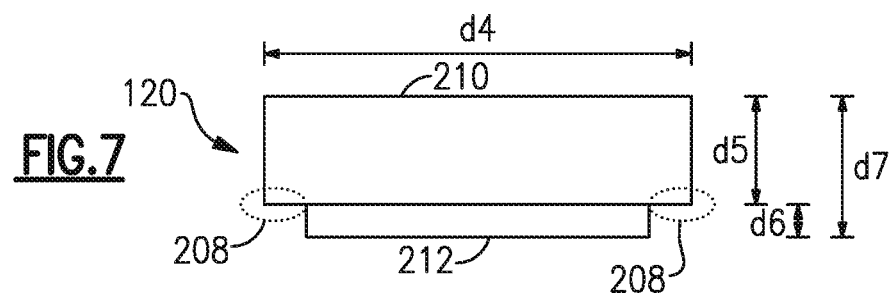
FIG. 7 shows that in some applications, a package, such as an un-shielded package, mountable to the carrier assembly of FIG. 5 can include a main structure and one or more features and/or structures on its underside.
Figure 8:
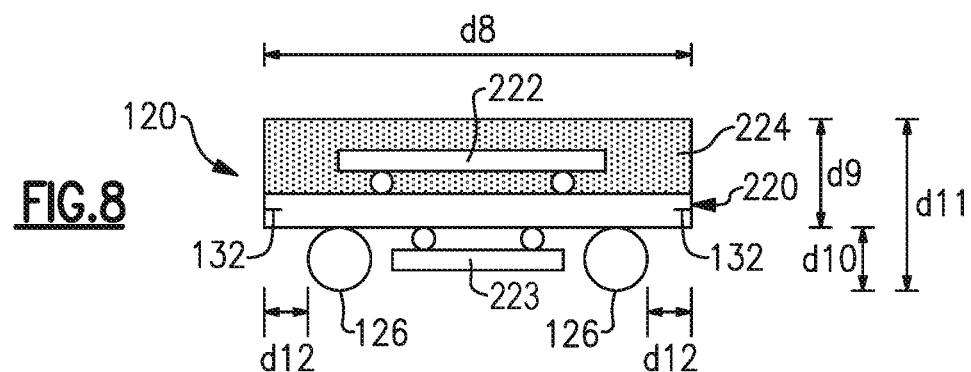
FIG. 8 shows an example of an un-shielded dual-sided package having a ball grid array (BGA).

FIGS. 6-8 show non-limiting examples of packages that can be processed with a carrier assembly (such as the carrier assembly 200 of FIG. 5) having one or more features as described herein. FIG. 6 shows that in some applications, a package (such as an un-shielded package 120) mountable to a carrier assembly 200 of FIG. 5 does not necessarily need to have any features or structures on its underside. Such a package can have a lateral dimension d2, and the corresponding opening of the carrier assembly 200 can be dimensioned to provide support for some or all of the perimeter portion 208 of the package 120. When supported on the carrier assembly 200 in such a manner, substantially all of the height d3 of the package 120 can be exposed above the carrier assembly.

FIG. 7 shows that in some applications, a package (such as an un-shielded package 120) mountable to a carrier assembly 200 of FIG. 5 can include a main structure 210 and one or more features and/or structures (collectively indicated as 212) on its underside. Such a package can have a lateral dimension d4, and the corresponding opening of the carrier assembly 200 can be dimensioned to provide support for some or all of the perimeter portion 208 of the package 120. When supported on the carrier assembly 200 in such a manner, substantially all of the height d5 of the package 120 (having an overall height of d7) can be exposed above the carrier assembly, and the underside feature/structure 212 (having an overall height of d6) can be positioned within the opening. As described herein, such an underside feature/structure (212) being within the opening can protect it from process step(s) such as formation of a conformal shield layer.

FIG. 8 shows an example of an un-shielded dual-sided package 120 having a ball grid array (BGA). In some embodiments, such a dual-sided package can be a more specific example or a variation of the example package 120 of FIG. 7. Accordingly, solder balls 126 can be considered to be part of the underside feature/structure 212 of FIG. 7.

In various examples described herein, BGAs of dual-sided packages can provide mounting/connection functionality. It will be understood that other types of mounting/connection structures can also be utilized for dual-sided packages, and processing of such packages can also benefit from use of a carrier assembly having one or more features as described herein.

In the example of FIG. 8, the un-shielded dual-sided package 120 is shown to have a lateral dimension of d8, and an overall height of d11. The overall height d11 can include a height of d9 generally associated with an un-shielded package having a packaging substrate 220 (e.g., a laminate substrate or a ceramic substrate) and an overmold structure 224. The overall height d11 can also include a height d10 associated with the solder balls 126.

In the example of FIG. 8, an underside-mounted part such as a die 223 can be implemented within an underside space defined by the underside of the packaging substrate 220 and the solder balls 126. The packaging substrate 220 is shown to include conductive features 132 having portions exposed on one or more side walls of the packaging substrate 220. The conductive features 132 can be electrically connected to a ground plane associated with the packaging substrate 220. Accordingly, when a conductive shielding layer is applied to such side walls (along with side walls and upper surface of the overmold structure 224), the conductive features 132 can provide an electrical connection between the conductive shielding layer and the ground plane.

In the example of FIG. 8, one or more components (collectively indicated as 222) can be mounted on the upper side of the packaging substrate 220. Such component(s) can include, for example, a semiconductor die having an integrated circuit, a surface-mount technology (SMT) device, a filter, and/or a filter-based device. Additional details and examples related to the dual-sided package 120 can be found in U.S. Patent Application Publication No. 2016/0099192, the disclosure of which is hereby expressly incorporated by reference herein in its entirety.

FIG. 8 shows that an un-shielded dual-sided package 120 can have the solder balls 126 arranged on its underside so as to yield a mountable area along some or all of its perimeter. Such a mountable area can be, for example, a perimeter strip having a width of d12. As described herein, such a mountable area can be utilized to mount the un-shielded dual-sided package 120 on a carrier assembly having one or more features as described herein.

Figure 9A:
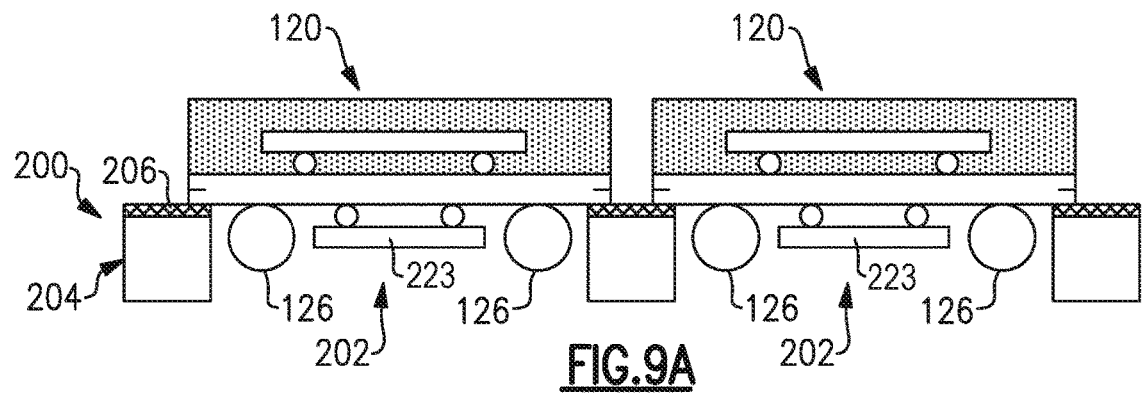
FIGS. 9A and 9B show side and plan views of a plurality of un-shielded dual-sided packages mounted on the adhesive side of a carrier assembly.
Figure 9B:
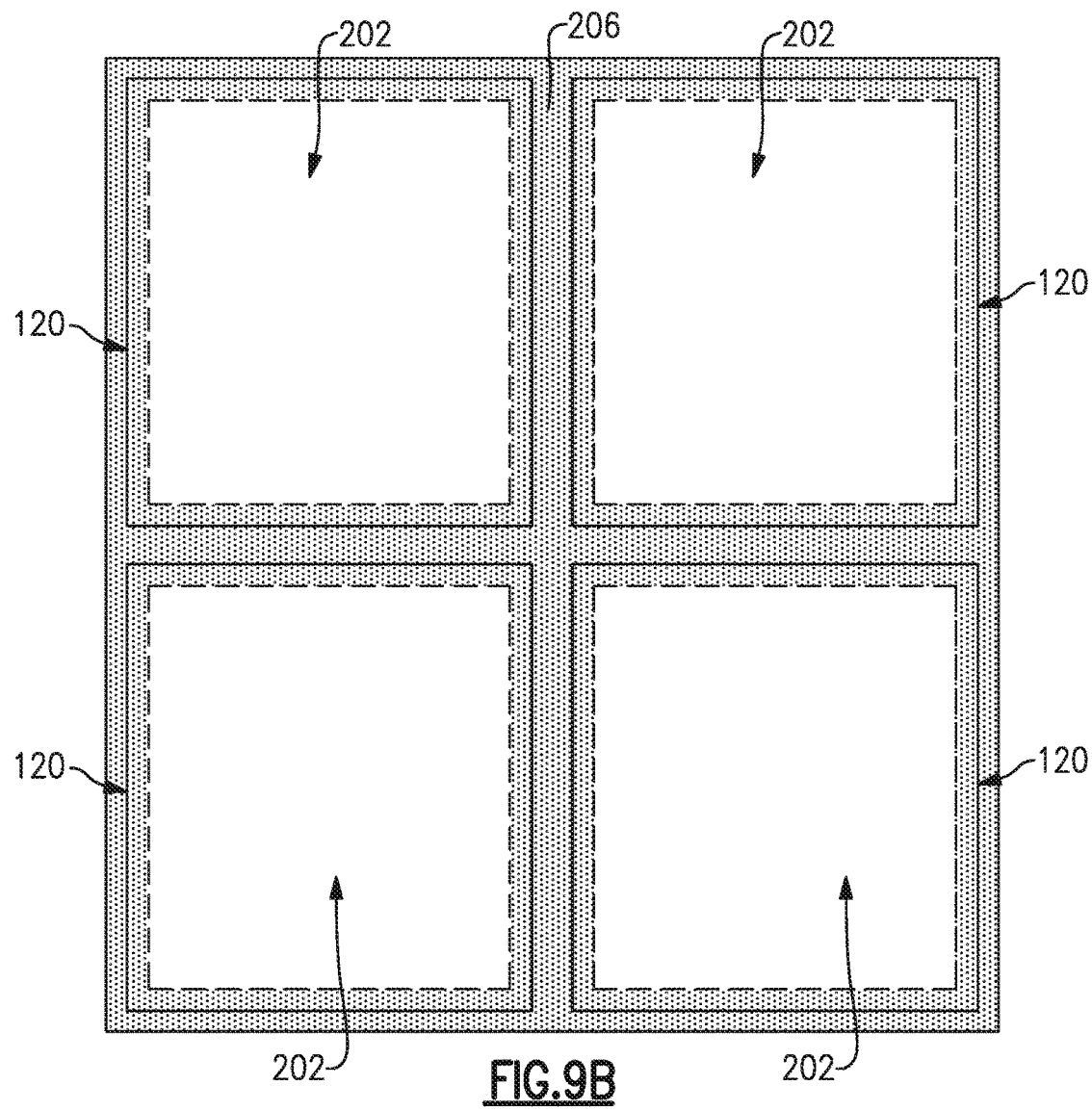

FIG. 9A shows a side view of a plurality of un-shielded dual-sided packages 120 mounted on the adhesive side of a carrier assembly 200. FIG. 9B shows a plan view of the same arrangement as in FIG. 9A. Each un-shielded dual-sided package 120 can be, for example, the dual-sided package of FIG. 8. The carrier assembly 200 can be, for example, the carrier assembly 200 of FIG. 5.

Referring to FIGS. 9A and 9B, each dual-sided package 120 is shown to be mounted so that some or all of its perimeter mountable area engages corresponding portions of the adhesive layer 206 around the opening 202. In the plan view of FIG. 9B, such an adhesive engagement between the dual-sided package 120 and the adhesive layer 206 is shown to extend substantially completely around the corresponding opening 202. It will be understood that in some embodiments, such an adhesive engagement does not necessarily need to extend completely around a given opening. For example there may be one or more gaps without adhesive layer for a given side of the opening. In another example, one or more sides of the opening may or may not have an adhesive layer.

In the example shown in FIG. 9A, the plate 204 is shown to have a thickness that is greater than the overall vertical dimension associated with extension of each solder ball 126 from the underside of the packaging substrate. Accordingly, the solder balls 126 as well as the underside component 223 can remain substantially within a space defined by the opening 202 and the upper and lower planes associated with the upper and lower sides of the carrier assembly 200.

Figure 10A:
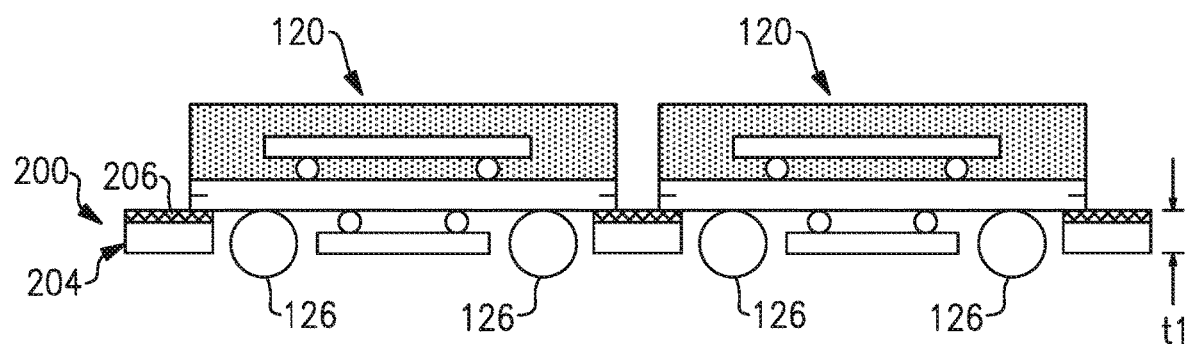
FIGS. 10A-10C show that a carrier assembly configured to engage the underside perimeter portions of the dual-sided packages can allow a plate to have different thicknesses without impacting how such packages are mounted thereon.
Figure 10B:
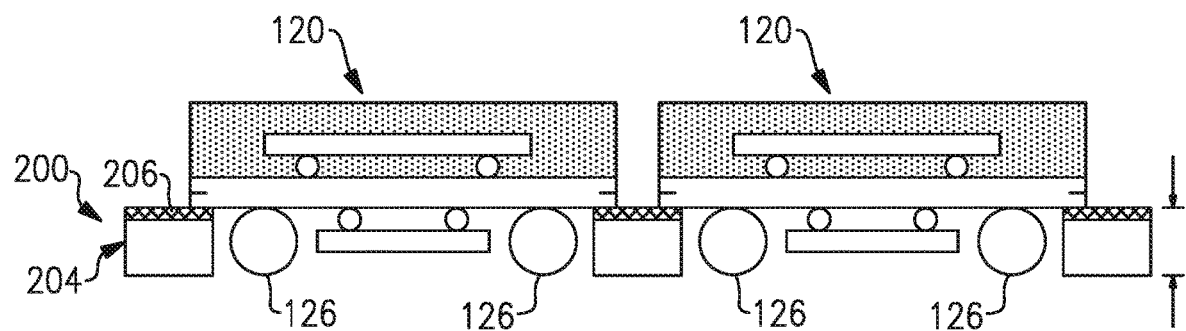
Figure 10C:
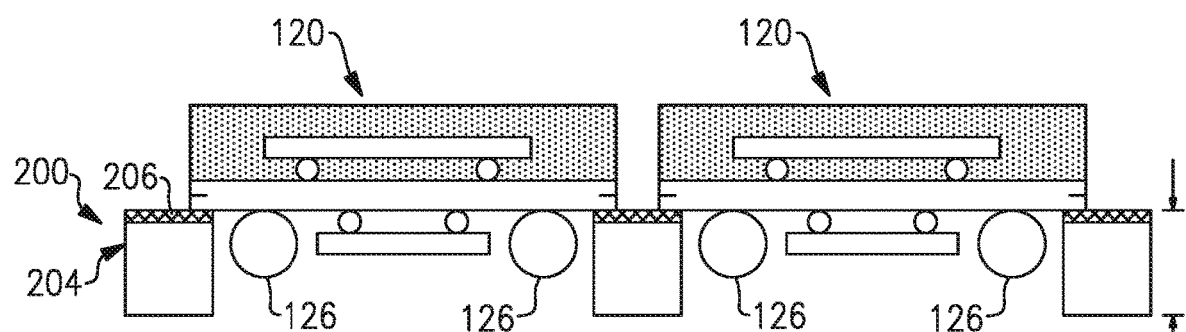

FIGS. 10A-10C show that the carrier assembly 200 being configured to engage the underside perimeter portions of the dual-sided packages 120 can allow a plate 204 to have different thicknesses without impacting how such packages are mounted thereon. For example, FIG. 10A shows that in some embodiments, a plate 204 of a carrier assembly 200 can be relatively thin (thickness t1). Accordingly, the solder balls 126 of the dual-sided packages 120 mounted thereon can have their lower portions extend beyond the lower plane of the plate 204. Preferably, such a thin plate can be sufficiently rigid to support the dual-sided packages 120. Assuming so, it is noted that the thin-ness of the plate 204 generally does not impact the mounting configuration, since the adhesive engagement occurs at the upper surface of the carrier assembly 200.

FIG. 10B shows that in some embodiments, a plate 204 of a carrier assembly 200 can have a thickness (t2), such that when the dual-sided packages 120 are mounted thereon, the lower portions of the solder balls 126 are at a similar level as the lower plane of the plate 204. Such a configuration can allow, for example, use of a frame carrier that is designed for the example of FIGS. 3A-3D. Again, it is noted that the thin or thickness of the plate 204 generally does not impact the mounting configuration, since the adhesive engagement occurs at the upper surface of the carrier assembly 200.

FIG. 10C shows that in some embodiments, a plate 204 of a carrier assembly 200 can have a thickness (t3), such that when the dual-sided packages 120 are mounted thereon, the lower portions of the solder balls 126 are at a level above the lower plane of the plate 204. Such a configuration can allow, for example, the solder balls 126 to remain substantially within the space defined by the corresponding opening and upper and lower planes of the carrier assembly 200.

In some embodiments, the thickness of a given adhesive layer 206 can be much less than the thickness of the corresponding plate 204. In such a configuration, the overall thickness of the carrier assembly 200 can depend mostly on the thickness of the plate 204. However, it will be understood that the thickness of the adhesive layer 206 itself can have different values to provide different overall thicknesses for the carrier assembly 200.

Figure 11A:
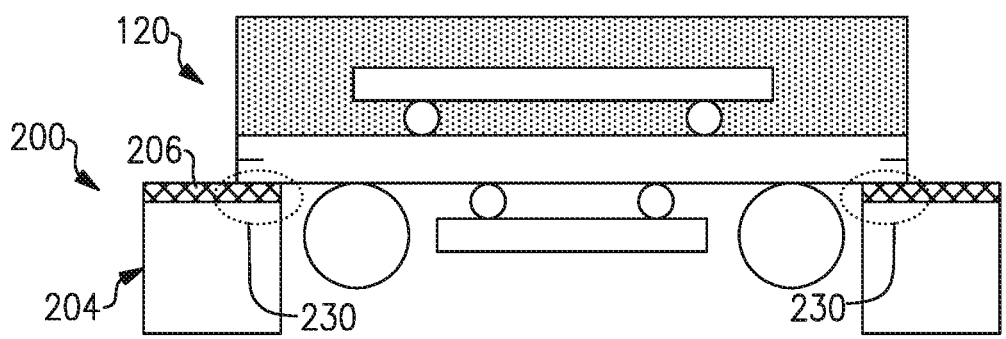
FIGS. 11A-11C show that a carrier assembly having one or more features as described herein can advantageously provide tolerance in lateral position of a dual-sided package mounted thereon.
Figure 11B:
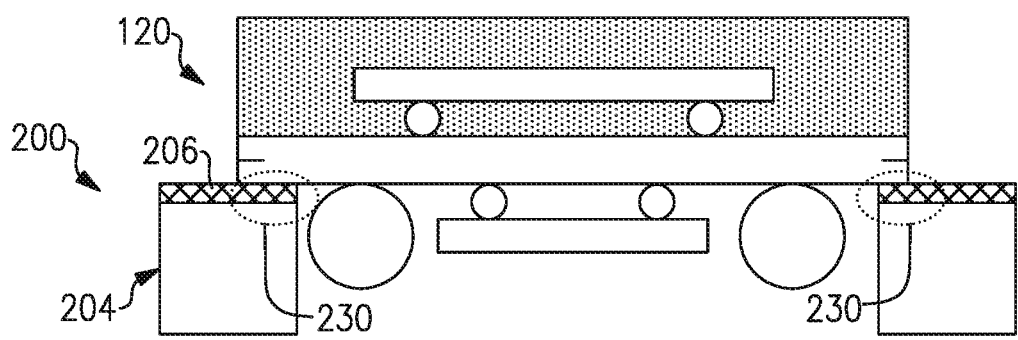
Figure 11C:
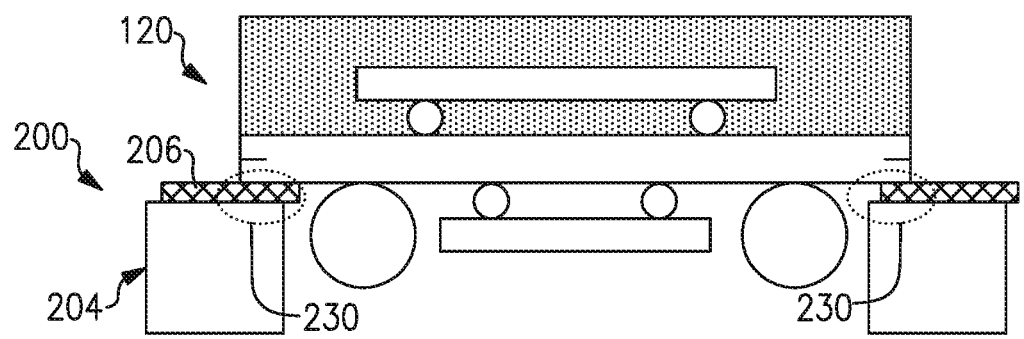

FIGS. 11A-11C show that a carrier assembly 200 having one or more features as described herein can advantageously provide tolerance in lateral position of a dual-sided package 120 mounted thereon. FIG. 11A shows an example in which a dual-sided package 120 is mounted on a carrier assembly 200 so as to be generally centered with respect to the corresponding opening. Accordingly, adhesive engagement areas 230 on both sides of the opening can have approximately same lateral dimensions.

FIG. 11B shows that in some processing situations, a dual-sided package 120 may be mounted on a carrier assembly 200 so as to be off-center. Such an off-center positioning can result from, for example, variations in pick-and-place accuracy. In the example shown in FIG. 11B, the off-center position of the dual-sided package 120 results in the dual-sided package 120 being shifted to the left from the center position. Even with such a left-ward shift, each of the left and right sides of the dual-sided package 120 can have a sufficient adhesive engagement area 230 for proper mounting and subsequent processing step(s).

In the examples of FIGS. 11A and 11B, it is assumed that the patterned openings of the adhesive layer 206 substantially match the corresponding openings of the plate 204. FIG. 11C shows that in some processing situations, there may be variations among the openings of the adhesive layer 206 and the plate 204. For example, an adhesive layer 206 is shown to be implemented on a plate 204 such that the opening of the adhesive layer 206 is laterally shifted (e.g., to the right) with respect to the opening of the plate 204. FIG. 11C further shows that even with such a mis-alignment between the adhesive layer 206 and the plate 204, a dual-sided package 120 can still be mounted on the carrier assembly 200 so as to yield a sufficient adhesive engagement area 230 for each of the left and right sides of the dual-sided package 120.

In the examples of FIGS. 11A-11C, it is assumed that the opening of the adhesive layer 206 is dimensioned approximately the same as the opening of the plate 204. Such configurations between the adhesive layer 206 and the plate 204 are depicted in FIGS. 12A and 12B. More particularly, in the example of FIG. 12A, the opening of the adhesive layer 206 is shown to be dimensioned substantially the same as that of the opening of the plate 204, and the two openings are shown to substantially match in their lateral positions. In the example of FIG. 12B, the opening of the adhesive layer 206 is shown to be also dimensioned substantially the same as that of the opening of the plate 204; however, the opening of the adhesive layer 206 is shown to be shifted laterally (e.g., to the right) with respect to the opening of the plate 204.

FIGS. 12C and 12D show that there can be other types of mismatches between an opening of the adhesive layer 206 and an opening of the plate 204. For example, FIG. 12C shows that an opening of the adhesive layer 206 can be generally smaller than the corresponding opening of the plate 204. Accordingly, there can be an overhang of the adhesive layer 206 at one or more the edges of the opening of the plate 204.

For example, in the example depicted in FIG. 12C, the opening of the adhesive layer 206 is generally centered with respect to the opening of the plate 204, similar to the centered example of FIG. 12A. Similar to the off-centered example of FIG. 12B, the opening of the adhesive layer 206 can be laterally shifted with respect to the opening of the plate 204. In such an off-center situation, there may be an overhang of the adhesive layer 206 on both of the left and right sides of the opening of the plate 204 (with one overhang being longer than the other overhang), an overhang of the adhesive layer 206 on one side of the opening of the plate 204 and generally matching of the edges of the adhesive layer 206 and the plate 204 on the opposing side of the opening of the plate 204, or an overhang of the adhesive layer 206 on one side of the opening of the plate 204 and a receded edge of the opening of the adhesive layer 206 on the opposing side of the opening of the plate 204.

In another example, FIG. 12D shows that an opening of the adhesive layer 206 can be generally larger than the corresponding opening of the plate 204. Accordingly, one or more perimeter portions of the opening of the plate 204 may not have an adhesive layer thereon.

In the example depicted in FIG. 12D, the opening of the adhesive layer 206 is generally centered with respect to the opening of the plate 204, similar to the centered example of FIG. 12A, such that both of the left and right sides of the opening of the plate 204 have receded adhesive layer edges. Similar to the off-centered example of FIG. 12B, the opening of the adhesive layer 206 can be laterally shifted with respect to the opening of the plate 204. In such an off-center situation, there may be different amounts of receding of the adhesive layer edges on the two sides of the opening of the plate 204, or only one side of the opening of the plate 204 may have a receded edge of the adhesive layer 206. In the latter case, the other side of the opening of the plate 204 can have the corresponding edge of opening of the adhesive layer 206 generally match the edge of the opening of the plate 204, or form an overhang beyond the edge of the opening of the plate 204.

As described herein, variations in a carrier assembly, such as the examples of FIGS. 12A-12D, can be tolerated when devices such as dual-sided packages are mounted on the carrier assembly.

FIGS. 13-20 show various examples of how a carrier assembly 200 having one or more features as described herein can be fabricated or prepared for use. For example, FIGS. 13A and 13B show that a carrier assembly 200 can be assembled by aligning and attaching a pre-cut adhesive layer 206 (e.g., a pre-cut double-sided tape) on a first side of a plate 204 having corresponding openings. More particularly, FIG. 13A depicts the pre-cut adhesive layer 206 being introduced (arrow 240) onto the first side of the plate 204. FIG. 13B shows the adhesive layer 206 attached to the first side of the plate 204 so as to yield the carrier assembly 200.

Figure 13A:
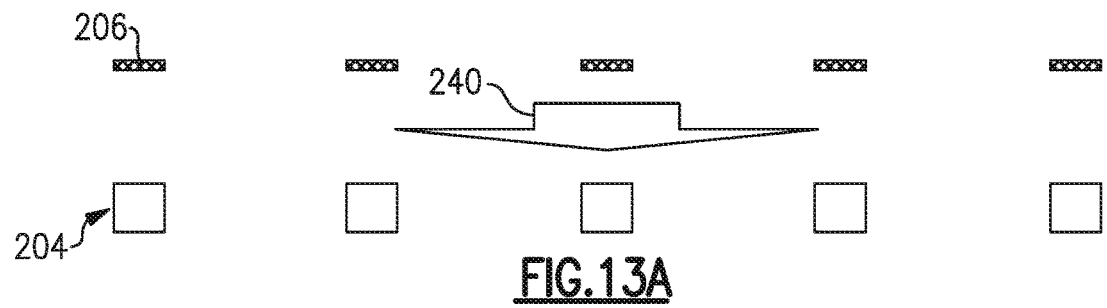
FIGS. 13A and 13B show that a carrier assembly can be assembled by aligning and attaching a pre-cut adhesive layer on a first side of a plate having corresponding openings.
Figure 13B:
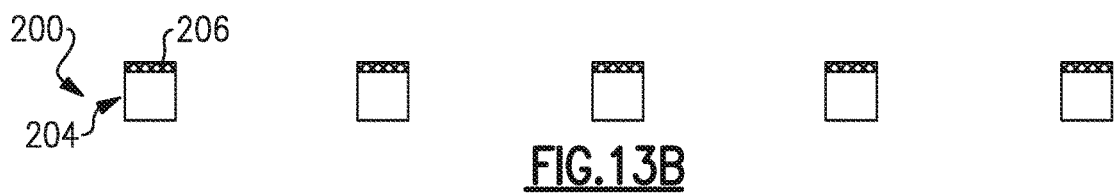

In some embodiments, the pre-cut tape 206 can include, for example, a removable liner on its upper side (e.g., the upper side of the carrier assembly 200 as shown in FIG. 13B). Such a liner can be configured to protect the adhesive surface of the tape 206 until the carrier assembly 200 is ready to receive devices (e.g., un-shielded dual-sided packages).

Figure 14A:
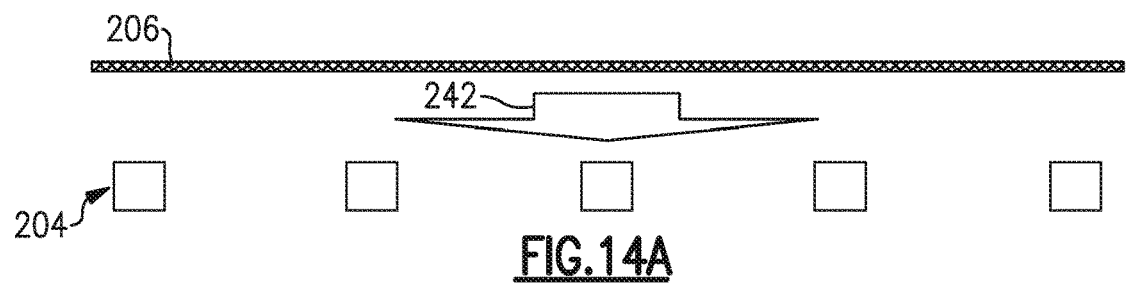
FIGS. 14A-14D show that a carrier assembly can be fabricated by forming openings on an adhesive layer after an adhesive layer is attached to a first side of a plate.
Figure 14B:
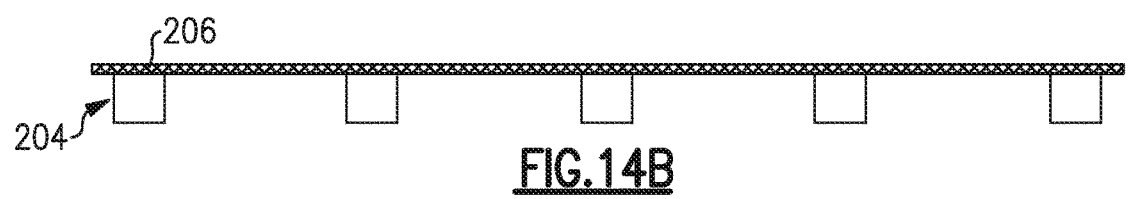

In another example, FIGS. 14A-14D show that a carrier assembly 200 can be fabricated or prepared for use by forming openings on an adhesive layer (e.g., a double-sided tape) after the adhesive layer is attached to a first side of a plate. More particularly, FIG. 14A shows a solid adhesive layer 206 being introduced (arrow 242) onto a first side of a plate 204 having a plurality of openings. FIG. 14B shows the solid adhesive layer 206 attached to the first side of the plate 204 so as to yield a partially-complete carrier assembly. It is noted that since there are no openings in the solid adhesive layer 206 at this stage, alignment between the adhesive layer 206 and the plate 204 may not be as important as in the example of FIGS. 13A and 13B.

Figure 14C:
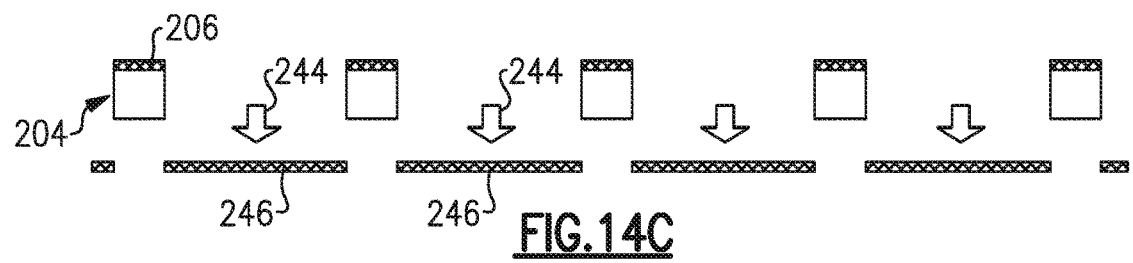
Figure 14D:
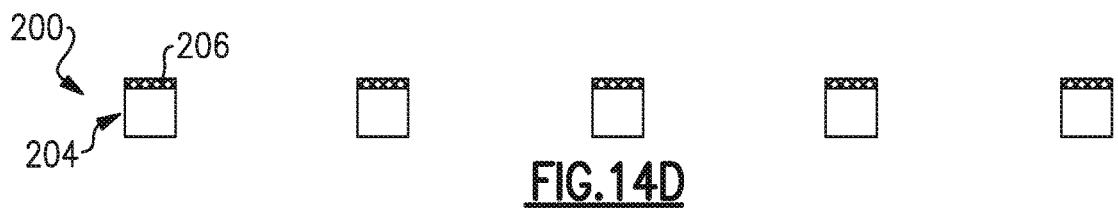

FIG. 14C shows portions 246 of the solid adhesive layer 206 being removed (arrows 244) so as to yield openings of the adhesive layer 206 that correspond to the openings of the plate 204. FIG. 14D shows the portions (246 in FIG. 14C) of the adhesive layer removed so as to yield the carrier assembly 200 having the adhesive layer 206 on the first side of the plate 204.

In some embodiments, the solid adhesive layer 206 of FIGS. 14A and 14B can include, for example, a removable liner on its upper side (e.g., the upper side of the partially-complete carrier assembly as shown in FIG. 14B). Such a liner can remain on the remaining portion of the solid adhesive layer after the portions 246 are removed. Such a liner can be configured to protect the adhesive surface of the tape solid adhesive layer until the carrier assembly 200 is ready to receive devices (e.g., un-shielded dual-sided packages).

In the example of FIGS. 14A-14D, it will be understood that the removal of the portions 246 from the solid adhesive layer 206 can be achieved in a number of ways, including, for example, mechanical cutting, mechanical punching, laser cutting, etc. FIGS. 15A-15D show an example where laser cutting can be utilized to remove portions of a solid adhesive layer mounted on a first side of a plate having a plurality of openings. For the purpose of description, it will be assumed that such an assembly of the solid adhesive layer and the plate can be similar to the partially-complete assembly of FIG. 14B.

Figure 15A:
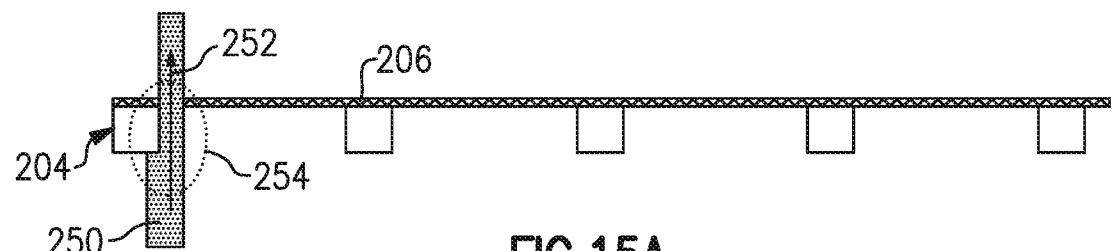
FIGS. 15A-15D show an example where laser cutting can be utilized to remove portions of a solid adhesive layer mounted on a first side of a plate having a plurality of openings.

FIG. 15A shows an example stage where a laser beam 250 is being applied along a first edge of an opening of the plate 204 so as to result in a cut in the solid adhesive layer 206 along the same first edge. In some embodiments, such a laser beam can be applied from the second side (e.g., the lower side as shown in FIG. 15A) of the plate 204 opposite from the first side with the adhesive layer 206. In such a configuration, a portion 252 of the laser beam 250 incident on the underside of the adhesive layer 206 can be defined by the first edge of the opening of the plate 204 (e.g., by masking a portion of the laser beam 250 incident outside of the opening). Accordingly, even if a relatively wide laser beam is utilized, the resulting cut in the adhesive layer 206 can substantially match the first edge. Such laser cuts can be made along other portions of opening of the plate 204 so as to yield a cut pattern that substantially matches the lateral profile of the opening (e.g., a rectangle).

In the example of FIG. 15A, a region where the laser cut is being made is indicated as 254. Additional details concerning such a region are described herein in reference to FIGS. 16A-16C.

Figure 15B:
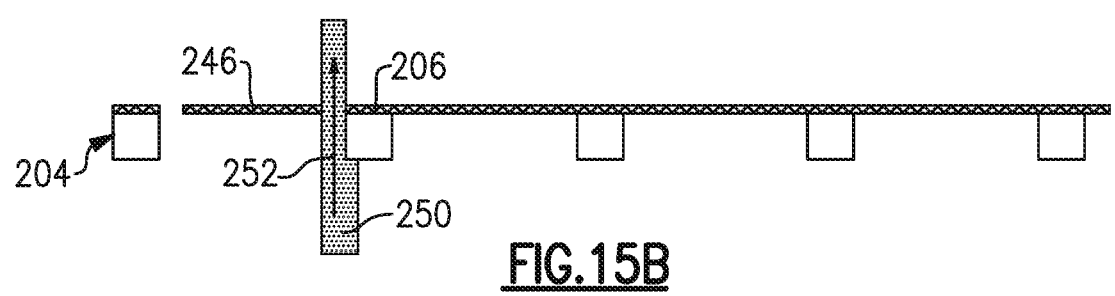

FIG. 15B shows an example stage where the laser beam 250 is being applied along a second edge of the same opening of the plate 204 as in FIG. 15A.

Figure 15C:
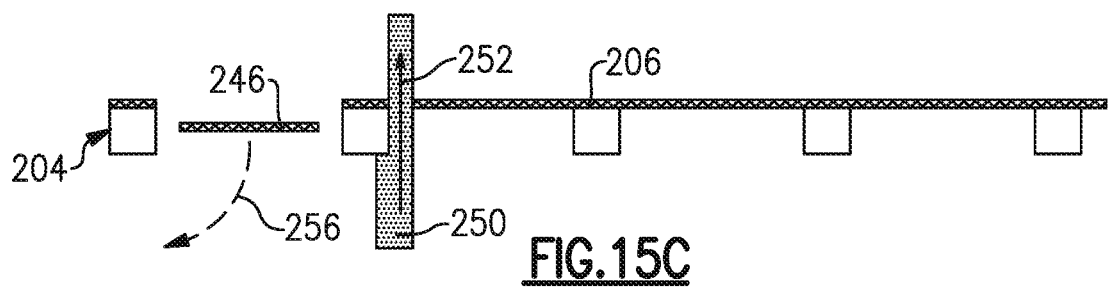

FIG. 15C shows an example stage where the laser cut has been completed for the portion of the adhesive layer 206 for the first opening of the plate 204, and laser cutting is being repeated for the portion of the adhesive layer for the second opening of the plate 204. FIG. 15C further shows that a portion 246 remaining from the first laser cut can be detached from the adhesive layer 206 and be removed.

Figure 15D:
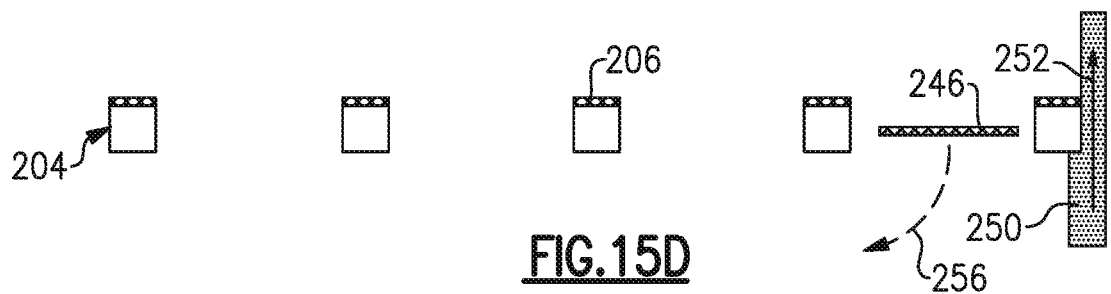

FIG. 15D shows an example stage where the laser cut has been completed for portions of the adhesive layer 206 for a plurality of openings of the plate 204. Remaining portions of the completed cut portions are depicted as having been removed or in the process of being removed. Such laser cuts can be repeated until all openings can be formed on the adhesive layer 206.

In some embodiments, the foregoing laser cuts in the adhesive layer 206 corresponding to the openings of the plate 204 can result in the remaining portions 246 to be substantially detached from the adhesive layer 206 to be removable by application of one or more forces. For example, when arranged as shown in FIGS. 15A-15D, completely detached remaining portions can fall downward through the corresponding openings of the plate 204 due to gravity. In another example, application of a vacuum can result in the remaining portions 246 being removed by a suction force of the vacuum. In such a configuration, the removal does not necessarily need to be through the lower side of the plate. It will be appreciated that one or more other removal forces can be utilized to remove the remaining portions 246.

FIGS. 15A-15D show that in some embodiments, the plate 204 can be positioned approximately horizontally such that the adhesive layer 206 is on its upper side. The laser beam 250 can be applied from the underside of the plate 204 to benefit from the foregoing masking functionality provided by the plate itself. In such an orientation, the remaining portions 246 resulting from the laser cuts can fall through the openings of the plate 204 if substantially free and otherwise un-impeded. In some embodiments, vacuum can be applied on the underside of the plate 204 to assist in such removal (depicted as arrows 256) of the remaining portions 246.

Figure 16A:
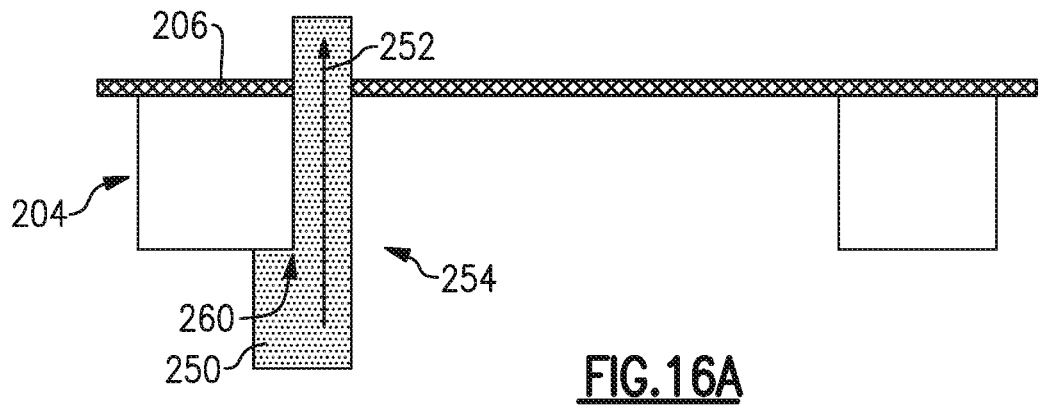
FIGS. 16A-16C show enlarged views of a portion of an example laser cutting configuration of FIG. 15A.
Figure 16B:
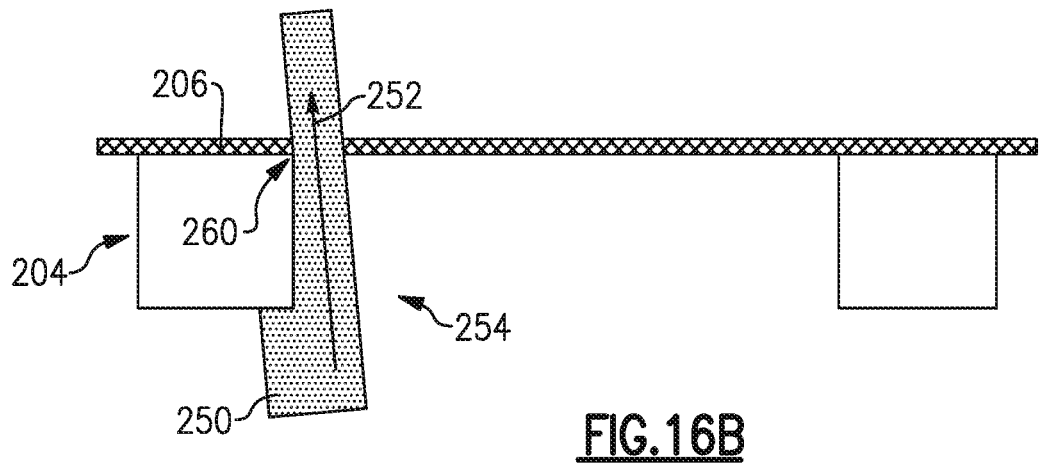
Figure 16C:
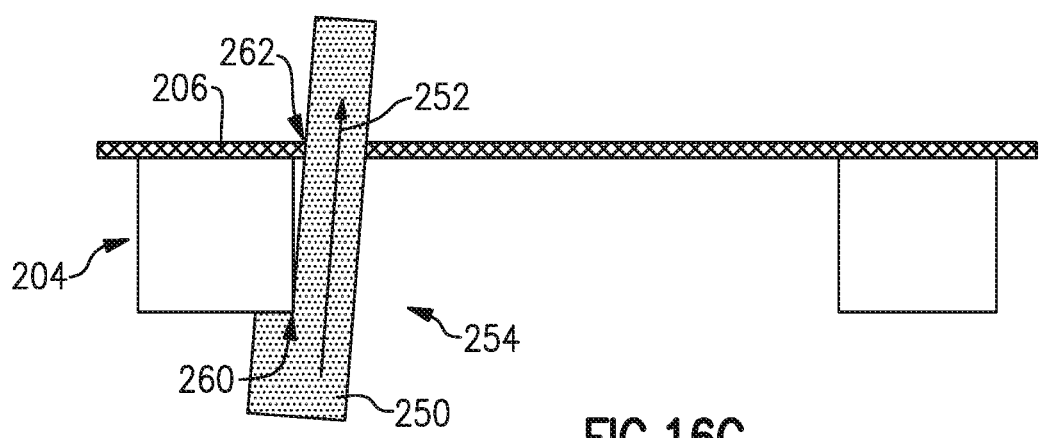

FIGS. 16A-16C show enlarged views of the portion indicated as 254 in FIG. 15A. FIG. 16A shows that the laser beam 250 can be applied at an indicent angle that is substantially normal to the plane of the plate 204. In such a configuration, a lower edge (260) of the opening of the plate 204 can provide the masking functionality; and assuming that the wall of the opening of the plate 204 is substantially parallel with the laser beam axis, little or no shadowing effect results from the masking feature 260. Accordingly, the resulting opening in the adhesive layer 206 cut out by the masked laser 252 can accurately match the opening of the plate 204.

FIGS. 16B and 16C show that in some situations, the laser beam 250 may not have a normal incidence orientation. For example, FIG. 16B shows that the laser beam 250 can be tilted to the left side when cutting along the left side of the opening of the plate 204. In such a situation, an upper edge (260) of the opening of the plate 204 can provide the masking functionality. Since the masking feature 260 is close to the adhesive layer 206, little or no shadowing effect results for the left-side cut of FIG. 16B from the left-tilted laser beam 250.

In another example, FIG. 16C shows that the laser beam 250 can be tilted to the right side when cutting along the left side of the opening of the plate 204. In such a situation, a lower edge (260) of the opening of the plate 204 can provide the masking functionality. Since the masking feature 260 is more distant from the adhesive layer 206 (when compared to the example of FIG. 16B), shadowing effect can result for the left-side cut of FIG. 16C from the right-tilted laser beam 250.

Assuming that the laser beam orientation remains in each example of FIGS. 16B and 16C, the resulting cut for the shown opening of the plate 204 can yield a generally matching edges (between the adhesive layer and the plate) on one side of the opening, and an overhang of the adhesive layer on the other side of the opening. As described herein, such variations in the openings of the adhesive layer 206 and the plate 204 can be tolerated by the resulting carrier assembly.

Figure 17A:
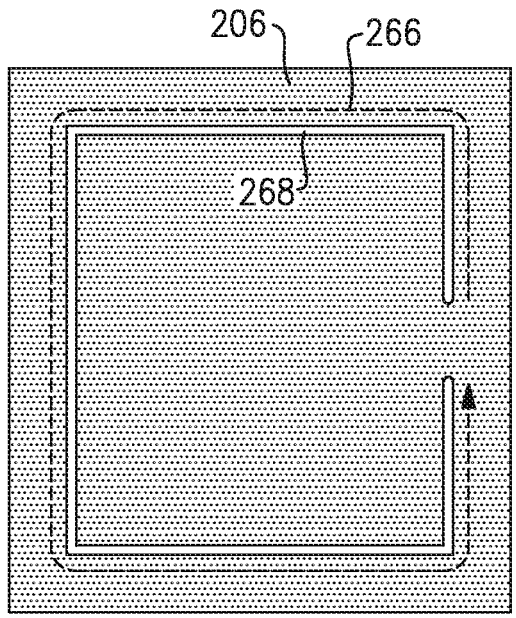
FIGS. 17A and 17B show that in some embodiments, a laser cut made in an adhesive layer can result in a generally continuous and complete cut that follows the lateral shape of a corresponding opening of a plate.
Figure 17B:
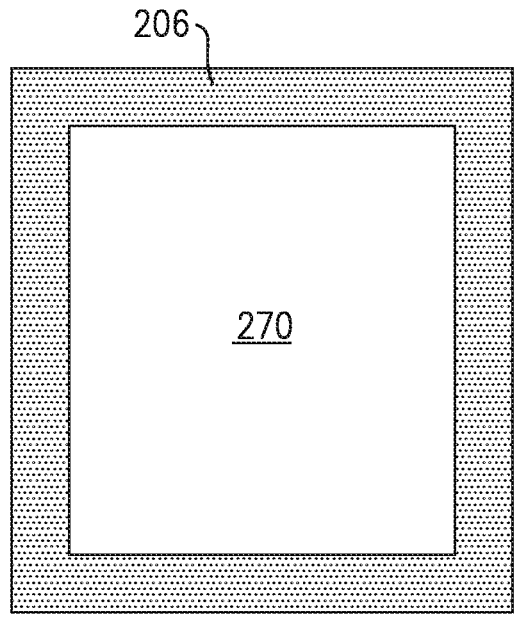

FIGS. 17A and 17B show that in some embodiments, a laser cut made in an adhesive layer 206 as described herein can result in a generally continuous and complete cut 268 that follows the lateral shape of the opening (e.g., a rectangular shaped opening) of a plate. Such a continuous cut can be implemented in a number of ways, including, for example, a single cutting pattern 266 (in FIG. 17A) around the opening, or a plurality of cutting patterns. FIG. 17B shows the resulting opening 270 in the adhesive layer 206 resulting from such a continuous cut.

Figure 18:
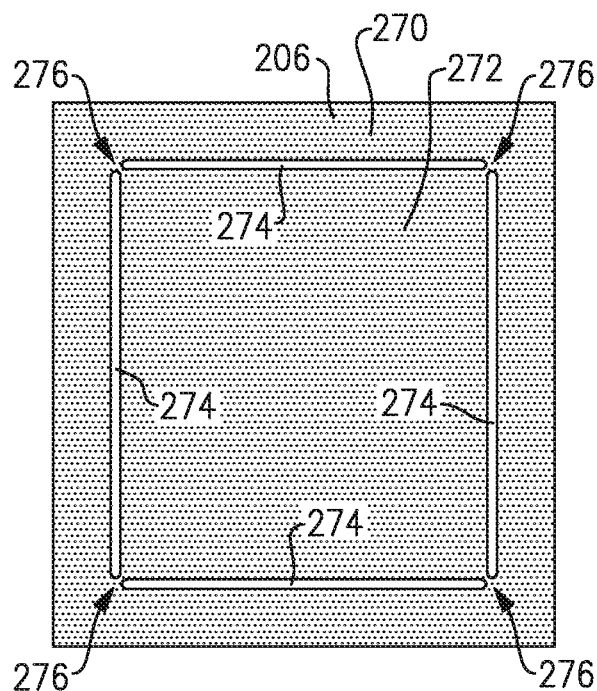
FIG. 18 shows an example where a laser cut made in an adhesive layer is not a continuous cut.
Figure 19:
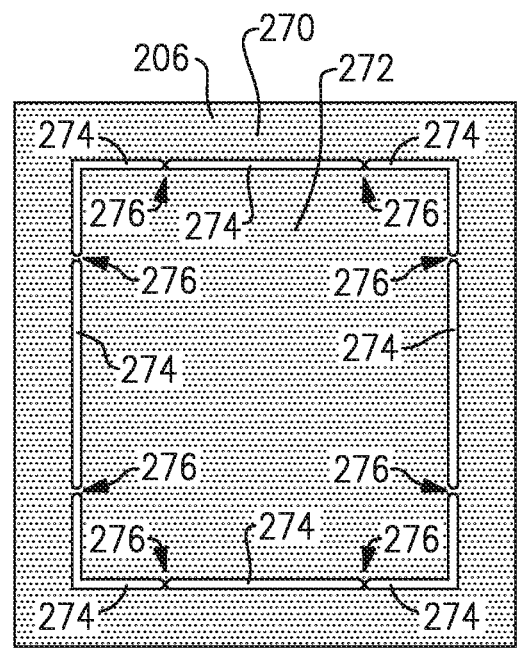
FIG. 19 shows another example where a laser cut made in an adhesive layer is not a continuous cut.

FIGS. 18 and 19 show that in some embodiments, laser cuts made in the adhesive layer 206 do not necessarily need to be continuous and complete cuts as in the example of FIGS. 17A and 17B. There may be applications where it is desirable to have a portion 272 inward of a cut pattern not fall away immediately after completion of the laser cut operation.

FIG. 18 shows an example where a cut pattern includes a continuous cut 274 along each edge of the rectangle, with un-cut portions 276 at the corners. Such an example cut pattern can keep the inner (272) and outer (270) portions of the adhesive layer 206 partially attached.

FIG. 19 shows an example where a cut pattern includes a plurality of continuous cut 274 interrupted by one or more of un-cut portions 276 along each edge of the rectangle. Such an example cut pattern can also keep the inner (272) and outer (270) portions of the adhesive layer 206 partially attached.

Figure 20A:
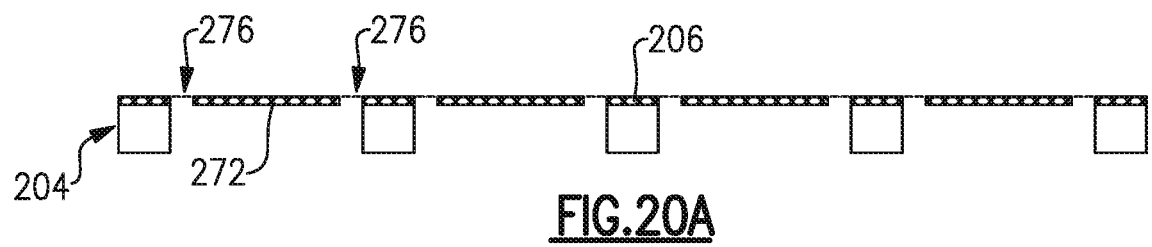
FIG. 20A shows a side view of a partially-complete assembly resulting from the partial cut pattern examples described in reference to FIGS. 18 and 19.

FIG. 20A shows a side view of a partially-complete assembly resulting from the partial cut pattern examples described in reference to FIGS. 18 and 19. In FIG. 20A, the un-cut portions in the adhesive layer 206 are depicted as 276. Accordingly, the each inner portion 272 (relative to the corresponding cut pattern) is shown to be partially attached to the adhesive layer 206.

Figure 20B:
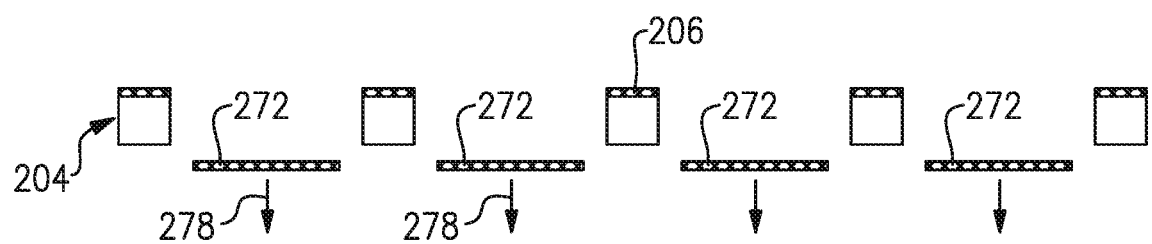
FIG. 20B shows an example where inner cut portions in the example of FIG. 20A are being removed from the adhesive layer.

FIG. 20B shows an example where the inner portions 272 are being removed (arrows 278) from the adhesive layer 206. Since the inner portions were partially attached to the adhesive layer 206, such a removal can be achieved by relatively light application of a removing force. Such a removing force can include, for example, mechanical punching, vacuum, air pressure, or any combination thereof.

Figure 20C:
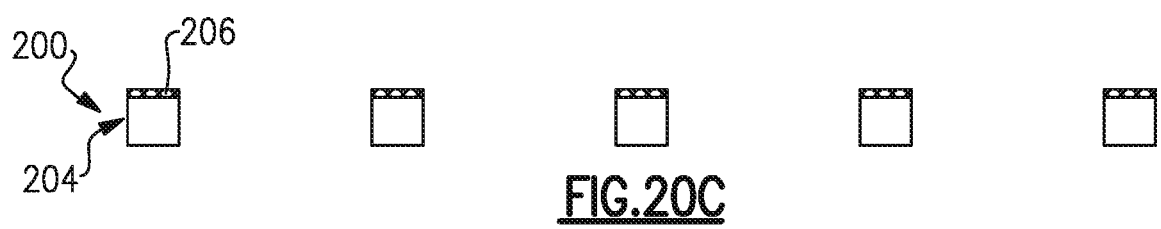
FIG. 20C shows a carrier assembly resulting from the process step of FIG. 20B.

FIG. 20C shows a resulting carrier assembly 200 having one or more features as described herein, after the inner portions 272 are removed.

As described herein, an adhesive layer utilized in a carrier assembly 200 can be a double-sided tape. In some embodiments, such a tape can be, for example, a double-sided tape based on polyimide film that is coated with high-temperature silicone adhesive on both sides of the film. Such a high-temperature property can allow adhesion property to be maintained during one or more processes (e.g., deposition of conformal shielding layer) with devices (e.g., dual-sided packages) mounted thereon. Such an adhesive material can be configured to also allow the devices to be removed after completion of the one or more processes.

In some embodiments, the foregoing example adhesive layer can be cut with a laser as described herein. Such a laser can be configured to effectively burn through the adhesive layer such as the polyimide film based tape. In some embodiments, laser cutting as described herein can be facilitated by an actuation system controlled by, for example, a processor. It will be understood that laser cutting examples as described herein can be achieved with a single laser or a plurality of lasers.

In some embodiments, a plate utilized in a carrier assembly 200 can be, for example, a metal plate or a plate having composition that can handle repeated exposures to a cutting laser as described herein. In some embodiments, such a plate can be in a rectangular shaped panel format. In some embodiments, such a plate can also have shapes other than the rectangular shape.

Figure 21:
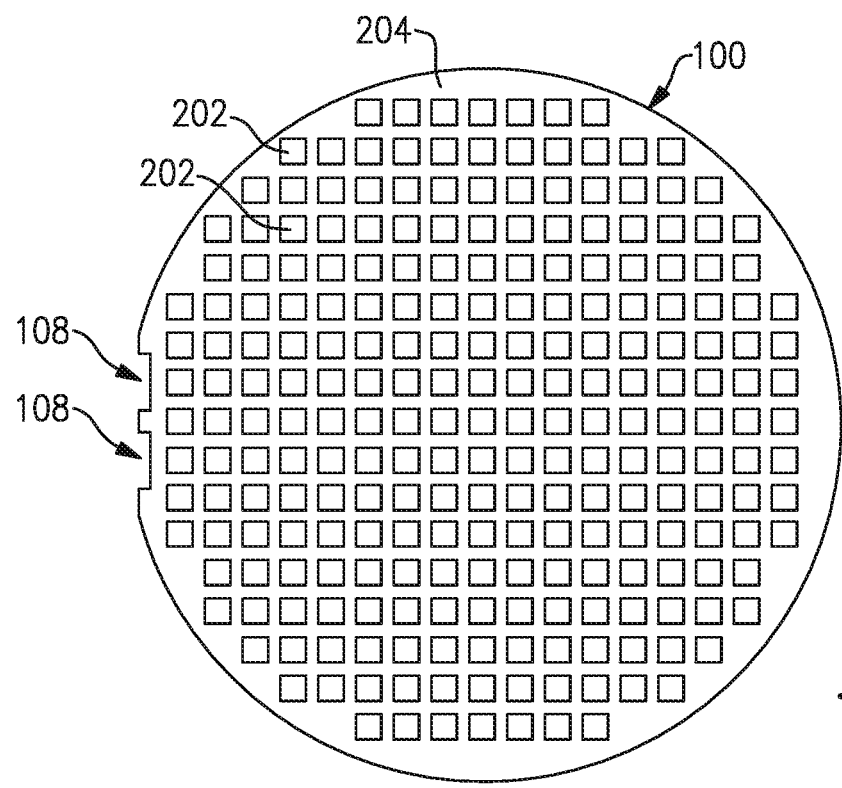
FIG. 21 shows an example where a plate of a frame carrier can have a shape similar to a wafer shape.
Figure 22:
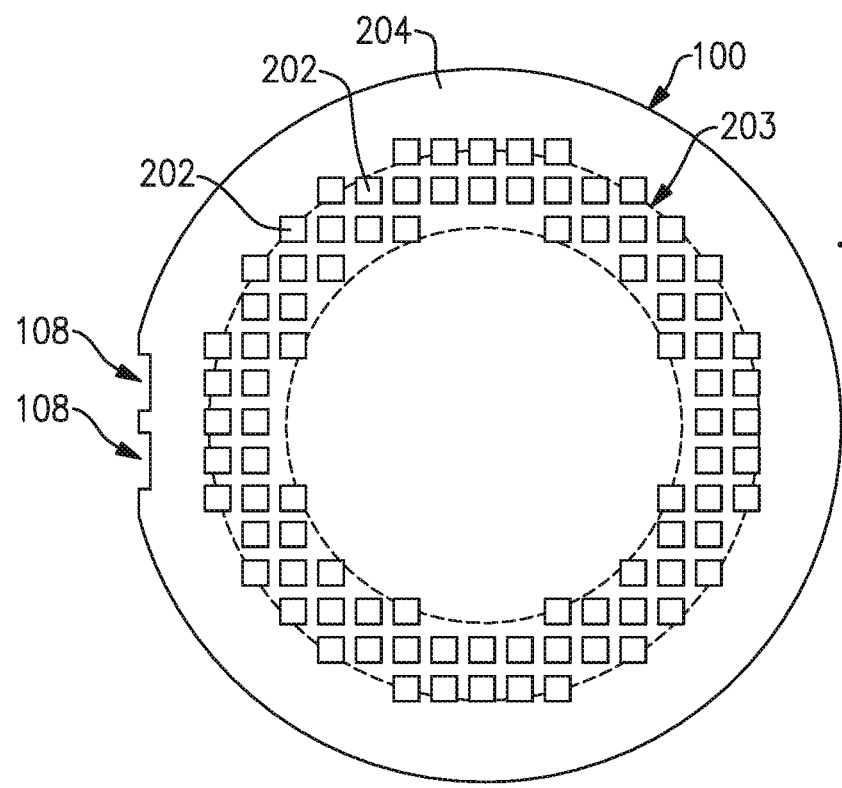
FIG. 22 shows another example where a plate of a frame carrier can have a shape similar to a wafer shape.

FIGS. 21 and 22 show examples where a plate 204 can have a shape similar to a wafer shape. In some applications, such a plate shape can allow the plate 204 to be used as a frame carrier 100, and thus as a carrier assembly, in processing apparatus such as a deposition apparatus (e.g., sputter deposition apparatus) that is designed to process wafers. Additional details and examples related to such wafer shaped frame carriers can be found in U.S. Patent Application Publication No. 2015/0325548.

In the example of FIG. 21, the frame carrier 100 is shown to include a wafer-shaped plate 204 that defines an array of openings 202 as described herein. In some embodiments, the plate 204 can also include one or more tape removal features such as notches 108 configured to facilitate easier removal of a tape (not shown) that can be provided on the upper side of the plate 204. In some embodiments, such a tape can have pre-cut openings similar to the example of FIGS. 13A and 13B, or begin as a solid tape and have openings formed similar to the example of FIGS. 14A-14D. In some embodiments, the plate 204 can also include one or more indexing and/or alignment features. In some embodiments, some or all of the tape removal features can be utilized for providing such indexing and/or alignment functionalities.

In the example of FIG. 21, the openings 202 are depicted as being arranged throughout the entire region of the plate 204. In some deposition applications, there may be a distribution in deposition rate as a function of, for example, angle relative to a center axis. In such a situation, it may be desirable to position the openings 202 in a selected annular region.

FIG. 22 shows an example configuration where a selected annular region 203 defines a plurality of openings 202 for accommodating singulated devices during a deposition process (e.g., a sputter deposition process). Thus, when the frame carrier 100 is rotated about the center axis during the deposition process, formation of the conformal shielding layers can be achieved with a desired deposition rate and desired uniformity.

In the example of FIG. 22, the openings 202 are depicted as being present within the annular region 203. It will be understood that there may be other openings on the same plate 204, such as in the example of FIG. 21. In such an example, only selected apertures (e.g., ones in the annular region) can be utilized for mounting of singulated devices to achieve similar functionality.

Similar to the example of FIG. 21, the frame carrier 100 of FIG. 22 can include a wafer-shaped plate 204 that defines an array of openings 202 as described herein. In some embodiments, the plate 204 can also include one or more tape removal features such as notches 108 configured to facilitate easier removal of a tape (not shown) that can be provided on the upper side of the plate 204. In some embodiments, such a tape can have pre-cut openings similar to the example of FIGS. 13A and 13B, or begin as a solid tape and have openings formed similar to the example of FIGS. 14A-14D. In some embodiments, the plate 204 can also include one or more indexing and/or alignment features. In some embodiments, some or all of the tape removal features can be utilized for providing such indexing and/or alignment functionalities.

It will also be understood that the openings in the plates 204 in FIGS. 21 and 22 do not necessarily need to be arranged in a rectangular arrangement in which the neighboring sides of the apertures are parallel. In some embodiments, apertures can be arranged to be in a non-rectangular arrangement. For example, such apertures can be arranged with circular symmetry about the center axis.

FIG. 23 shows a process 300 that can be implemented to form a plurality of shielded modules utilizing a carrier assembly having one or more features as described herein. FIGS. 24A-24D show examples of various stages corresponding to the process 300 of FIG. 23.

In block 302 of FIG. 23, a frame carrier having a patterned adhesive layer on a first side can be formed or provided. In FIG. 24A, a carrier assembly 200 can be based on such a frame carrier (with a plate 204) and the patterned adhesive layer 206 can be implemented on the first side (e.g., the upper side) of the plate 204.

In block 304 of FIG. 23, a plurality of un-shielded packages can be positioned on the first side of the frame carrier. As described herein, each un-shielded package can be partially within a corresponding opening defined by the frame carrier. In FIG. 24B, a plurality of un-shielded packages 120, each having a BGA and an underside component, are shown to be mounted on the adhesive layer 206 and relative to the corresponding openings 202. In such a mounted position, the underside portion (including the BGA and the underside component) of each un-shielded package 120 is shown to be generally within the corresponding opening 202.

In block 306 of FIG. 23, conformal shielding material can be applied on the exposed portions of the un-shielded packages mounted on the first side of the frame carrier. In FIG. 24C, such a conformal shielding material is shown to form a conformal shield layer 280 on the upper surface and exposed side walls of each package mounted on the adhesive layer 206. Such material is shown to be deposited on the exposed portions of the adhesive layer 206. Generally, the underside of the package is shown to be protected from such deposition by the mounting configuration.

In block 308 of FIG. 23, the resulting shielded module can be removed from the frame carrier. In FIG. 24D, such shielded modules (290) having the conformal shield layer 280 are shown to be removed from the upper surface of the carrier assembly 204. In some embodiments, such removal of the shielded modules 290 can be achieved by, for example, a pick-and-place apparatus. As described herein, the conformal shield layer 280 can be in electrical contact with a ground plane through one or more conductive features 132 exposed on the corresponding side wall(s) of the packages.

In the example of FIG. 24D, portions of the adhesive layer 206 are shown to have conformal shielding material deposited thereon. Accordingly, and depending on the extent of such a deposit, the adhesive layer can be replaced after one or more uses.

In the various examples described herein, a plate utilized in a frame carrier or a carrier assembly is depicted as having an array of openings, with each opening extending through the entire thickness of the plate. It is noted that because of devices being mounted on one side on the perimeter portions of the openings, effective mounting can be achieved generally independent of the plate's thickness. Accordingly, it is further noted that in some embodiments, the openings on a given plate do not necessarily need to be open on both sides of the plate. For example, appropriately dimensioned recesses can be formed on one side of a relatively thick plate or structure, and each of such recesses can be open only on that same side, and yet provide some or all of mounting and carrier functionalities as described herein.

Figure 25:
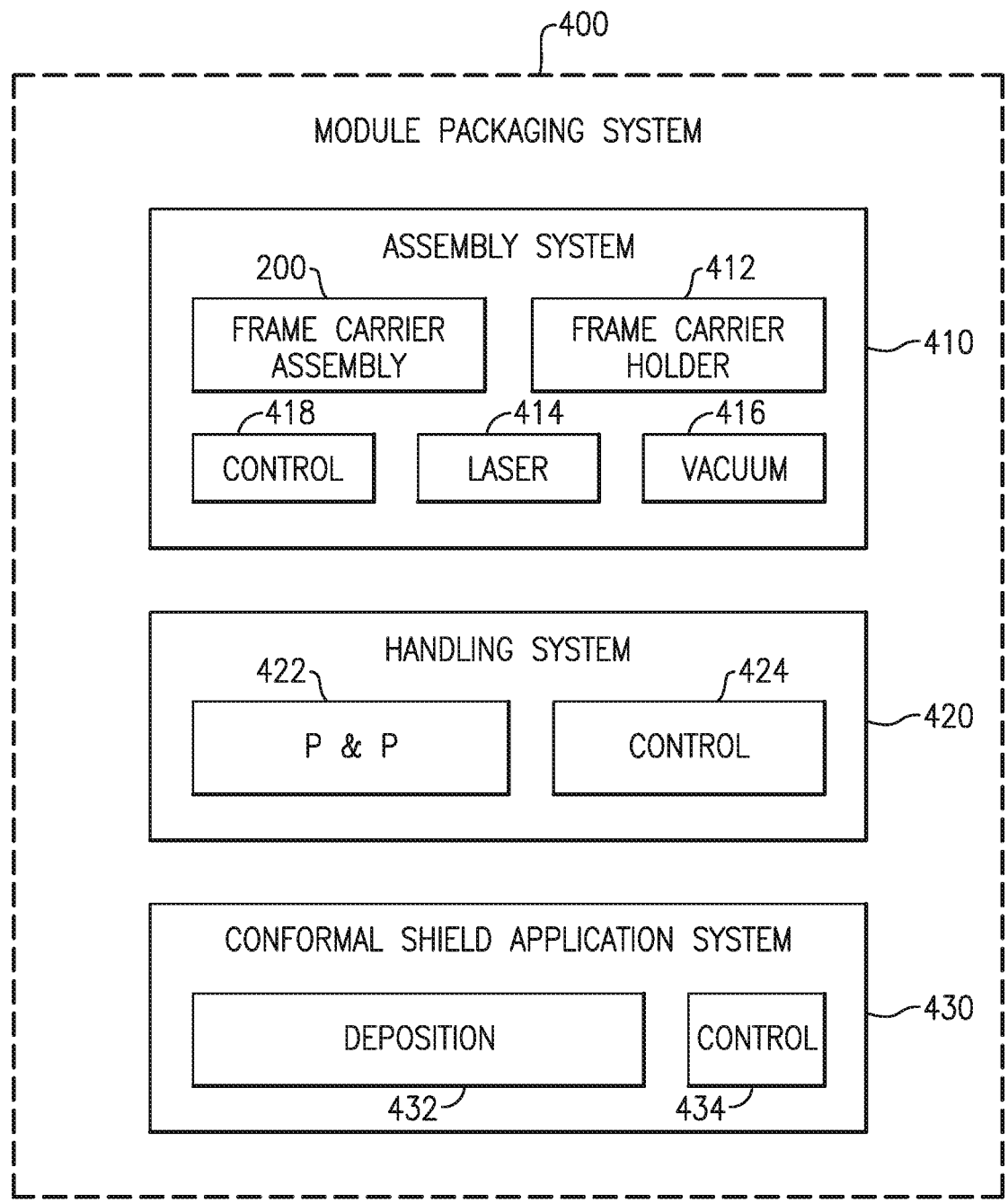
FIG. 25 depicts a module packaging system that can prepare and/or utilize one or more carrier assemblies.

FIG. 25 shows that in some embodiments, one or more carrier assemblies 200 can be fabricated or prepared by an assembly system 410. Such an assembly system can include, for example, a frame carrier holder 412 configured to hold a frame carrier during formation of a patterned adhesive layer thereon. The assembly system 410 can further include a laser device 414 configured to cut a pattern of openings in the adhesive layer as described herein. The assembly system 410 can further include a vacuum component 416 to allow effective removal of portions of the adhesive layer cut by the laser device 414. The assembly system 410 can further include a control component 418 configured to control one or more functionalities (e.g., laser motion control) associated with the formation of the one or more carrier assemblies.

In some embodiments, the foregoing assembly system 410 may or may not be part of a module packaging system 400. Such a module packaging system can include a handling system 420 having, for example, a pick-and-place apparatus 422 and a control component 424 for controlling such a pick-and-place apparatus.

In some embodiments, the module packaging system 400 can further include a conformal shield application system 430. Such a conformal shield application system can include, for example, a deposition apparatus 432, and a control component 434 for controlling such a deposition apparatus.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A module packaging system comprising:
an assembly system including a carrier assembly that includes a plate having a first side and a second side, and defining a plurality of openings, such that each opening extends through the plate between the first side and the second side, the plate including a tape removal feature, the carrier assembly further including a double-sided tape implemented on the first side of the plate, the double-sided tape defining a plurality of openings arranged to substantially match the openings of the plate, the double-sided tape being dimensioned such that the tape removal feature of the plate facilitates removal of the double-sided tape from the first side of the plate;
a handling system including a pick-and-place apparatus for placing a package over each opening of the plate such that the double-sided tape provides an adhesive engagement between a perimeter portion of an underside of the package and a perimeter portion about the opening of the double-sided tape; and
a conformal shield application system including a deposition apparatus for performing a deposition operation from the first side of the plate on the packages positioned over the respective openings of the plate.

2. The system of claim 1 wherein the underside of the package being attached to the perimeter portion about the opening of the double-sided tape results in the underside of each package being protected from exposure during the deposition operation.

3. The system of claim 1 wherein the underside of the package being attached to the perimeter portion about the opening of the double-sided tape results in upper surface and side walls of each package being open to exposure during the deposition operation.

4. The system of claim 1 wherein each package includes a radio-frequency circuit.

5. The system of claim 1 wherein the deposition apparatus of the conformal shield application system includes a sputter deposition apparatus for providing a sputter deposition operation.

6. The system of claim 1 wherein each opening of the double-sided tape is dimensioned to receive and accommodate an underside feature of the respective package when the perimeter portion of the underside of the package is adhesively engaged with the perimeter portion about the opening of the double-sided tape.

7. The system of claim 6 wherein the underside feature of the package includes a ball grid array having a plurality of solder balls.

8. The system of claim 7 wherein the plate has a thickness selected such that the solder balls of the package are within the opening of the plate when the perimeter portion of the underside of the package is adhesively engaged with the perimeter portion about the opening of the double-sided tape.

9. The system of claim 7 wherein the plate has a thickness selected such that a portion of each solder ball of the package extends beyond the second side of the plate when the perimeter portion of the underside of the package is adhesively engaged with the perimeter portion about the opening of the double-sided tape.

10. The system of claim 1 wherein each package is a singulated un-shielded package.

11. The system of claim 1 wherein the plate has a rectangular shape.

12. The system of claim 1 wherein the plate has a wafer-like shape.

13. The system of claim 12 wherein the deposition apparatus is configured to process wafers, such that the deposition apparatus is capable of process the carrier assembly having the plate with the wafer-like shape.

14. The system of claim 1 wherein the double-sided tape includes a polyimide film and adhesive layers provided on both sides of the polyimide film, each adhesive layer formed from a high-temperature adhesive material.

* * * * *